(12) United States Patent
Hamer et al.

(10) Patent No.: US 10,923,689 B2
(45) Date of Patent: Feb. 16, 2021

(54) METHOD FOR MASK-FREE OLED DEPOSITION AND MANUFACTURE

(71) Applicant: OLEDWorks LLC, Rochester, NY (US)

(72) Inventors: John Hamer, Rochester, NY (US); Jeffrey Spindler, Ontario, NY (US)

(73) Assignee: OLEDWorks LLC, Rochester, NY (US)

( * ) Notice: Subject to any disclaimer, the term of this patent is extended or adjusted under 35 U.S.C. 154(b) by 0 days.

(21) Appl. No.: 16/956,863

(22) PCT Filed: Jan. 18, 2019

(86) PCT No.: PCT/US2019/014106
§ 371 (c)(1),
(2) Date: Jun. 22, 2020

(87) PCT Pub. No.: WO2019/147479
PCT Pub. Date: Aug. 1, 2019

(65) Prior Publication Data
US 2020/0321564 A1    Oct. 8, 2020

Related U.S. Application Data

(60) Provisional application No. 62/621,616, filed on Jan. 25, 2018.

(51) Int. Cl.
*H01L 51/00* (2006.01)
*H01L 51/56* (2006.01)
*H01L 51/52* (2006.01)

(52) U.S. Cl.
CPC .......... *H01L 51/56* (2013.01); *H01L 51/0005* (2013.01); *H01L 51/0014* (2013.01);
(Continued)

(58) Field of Classification Search
None
See application file for complete search history.

(56) References Cited

U.S. PATENT DOCUMENTS

| 5,917,280 A | 6/1999 | Burrows et al. |
| 5,981,092 A | 11/1999 | Arai et al. |

(Continued)

FOREIGN PATENT DOCUMENTS

| WO | 2005109541 A1 | 11/2005 |
| WO | 2015129892 A1 | 9/2015 |
| WO | 2016103889 A1 | 6/2016 |

OTHER PUBLICATIONS

Shen et al., "Three-Color, Tunable, Organic Light-Emitting Devices", Science, vol. 276, 2009-2011 (Jun. 27, 1997); AAAS, Washington D.C.

(Continued)

*Primary Examiner* — Reema Patel

(57) ABSTRACT

A method for making an OLED lighting panel is disclosed. A patterned inorganic insulating layer is used to enclose an area over a first electrode layer leaving portions of the first electrode layer and substrate adjacent to the outside of the enclosure exposed. After uniform deposition of the organic layer(s), the organic layer(s) are selectively removed over the inorganic insulating layer and an adjacent portion of the substrate to form a sealing region. After uniform deposition of the second electrode, the enclosed area is encapsulated and any overlying layers over the first and second electrodes outside the enclosed area are removed resulting in an OLED within the enclosed area with electrode contact pads outside the enclosed area. The OLED can be manufactured at low cost with no or limited use of shadow masking and is suitable for roll-to-roll processes.

15 Claims, 29 Drawing Sheets

(52) U.S. Cl.
CPC ...... *H01L 51/0097* (2013.01); *H01L 51/5253* (2013.01); *H01L 2251/5338* (2013.01); *H01L 2251/5361* (2013.01); *H01L 2251/566* (2013.01)

(56) References Cited

U.S. PATENT DOCUMENTS

| | | | |
|---|---|---|---|
| 6,351,067 B2 | 2/2002 | Lee et al. |
| 6,617,054 B2 | 9/2003 | Hosokawa |
| 6,841,949 B2 | 1/2005 | Duggal |
| 7,271,012 B2 | 9/2007 | Anderson |
| 8,071,999 B2 | 12/2011 | Amelung et al. |
| 8,664,023 B2 | 3/2014 | Sonoda et al. |
| 8,680,693 B2 | 3/2014 | Kang et al. |
| 8,704,443 B2 | 4/2014 | Nakamura et al. |
| 8,836,204 B2 | 9/2014 | Kagotani et al. |
| 8,853,664 B2 | 10/2014 | Ogata et al. |
| 8,871,563 B2 | 10/2014 | Han et al. |
| 9,142,595 B2 | 9/2015 | Hamer |
| 9,209,366 B2 | 12/2015 | Maindron et al. |
| 9,313,835 B2 | 4/2016 | Miyai et al. |
| 2005/0019977 A1 | 1/2005 | Prakash |
| 2005/0023970 A1 | 2/2005 | Maeda et al. |
| 2013/0076263 A1 | 3/2013 | Storch et al. |
| 2013/0240867 A1 | 9/2013 | Zhou et al. |
| 2014/0103311 A1 | 4/2014 | Sung |
| 2014/0191201 A1 | 7/2014 | Hamer et al. |
| 2015/0179986 A1 | 6/2015 | Yan et al. |
| 2016/0072069 A1 | 3/2016 | Takeuchi |
| 2016/0126502 A1 | 5/2016 | Furukawa |
| 2016/0133868 A1 | 5/2016 | Rickers |
| 2016/0164046 A1 | 6/2016 | Uezawa et al. |
| 2016/0172330 A1 | 6/2016 | Hack et al. |
| 2016/0308131 A1 | 10/2016 | Kobayashi et al. |
| 2017/0104174 A1 | 4/2017 | Sakaguchi |

OTHER PUBLICATIONS

Liang et al., "Tunable full-color emission of two-unit stacked organic light emitting diodes with dual-metal intermediate electrode", Journal of Organometallic Chemistry, vol. 694, 2712-2716 (2009); Elsevier B.V.

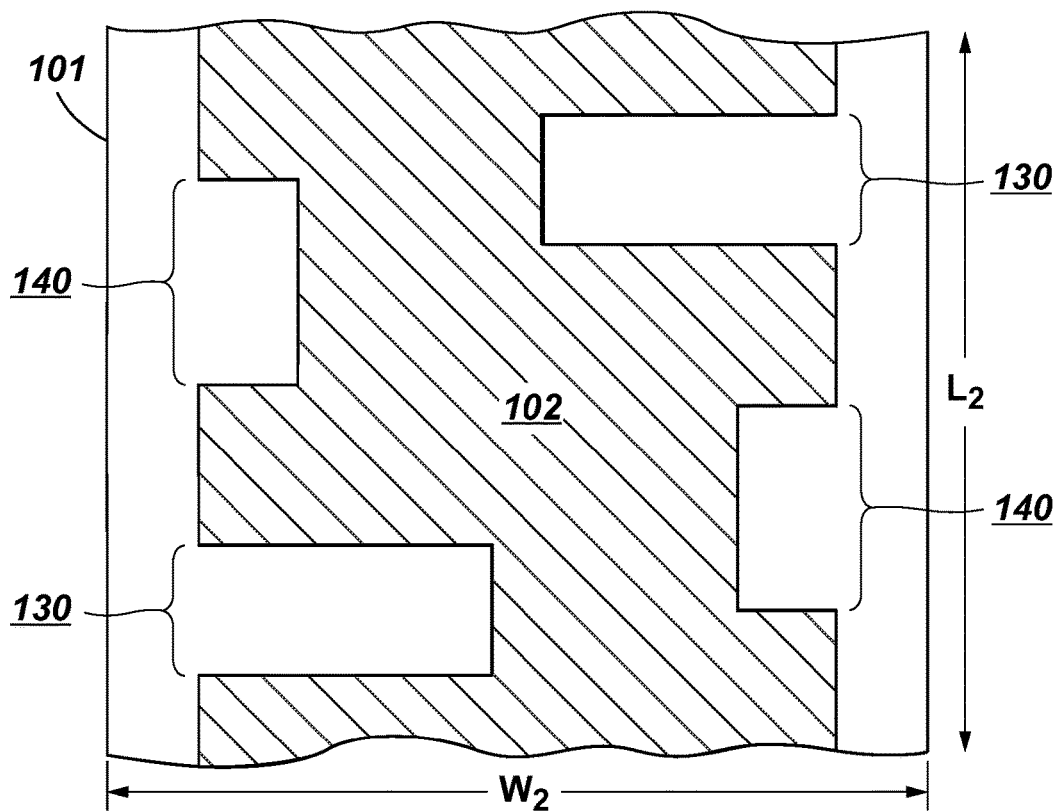
FIG. 11a
FIG. 11b
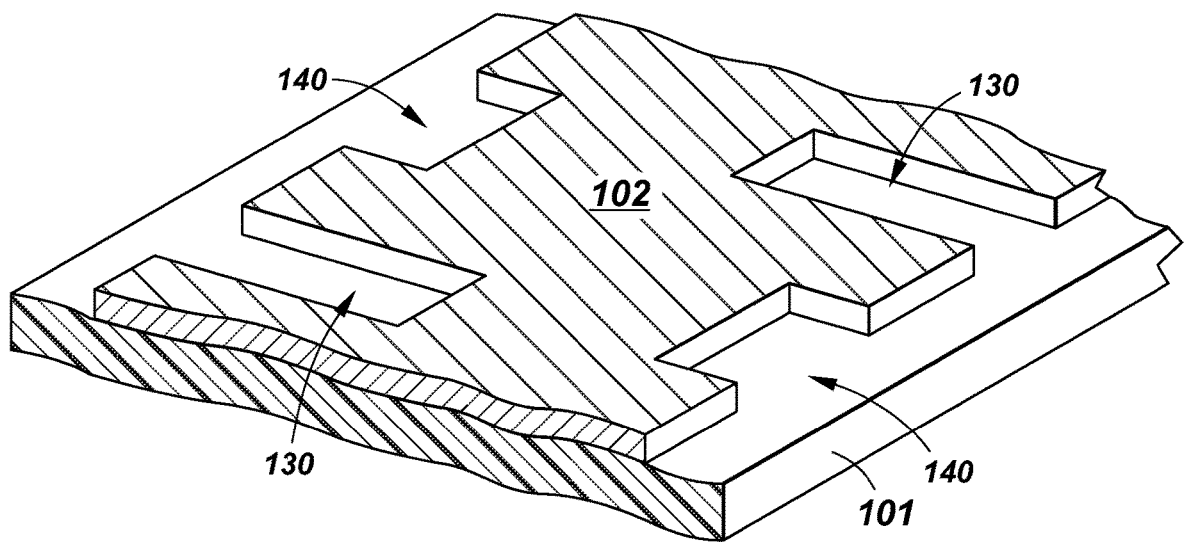

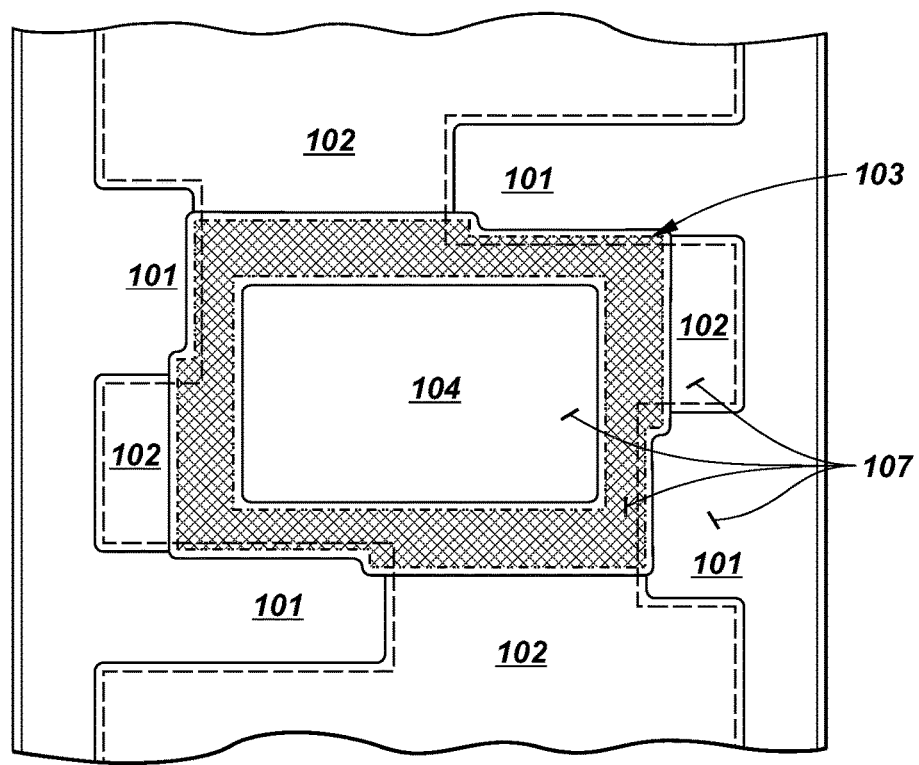
FIG. 13a
FIG. 13b
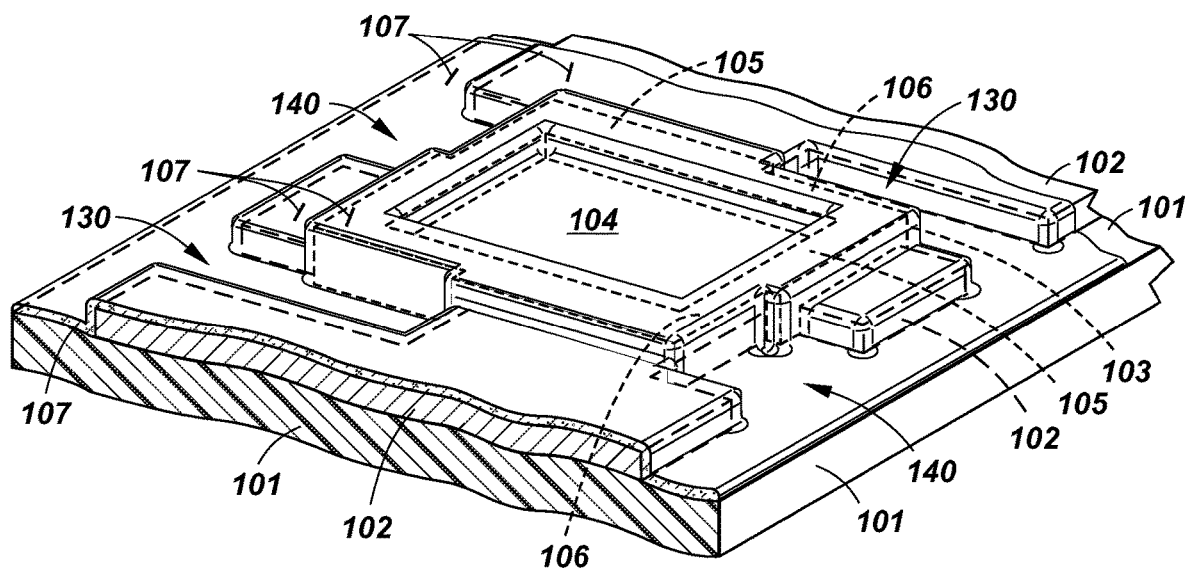

FIG. 19a
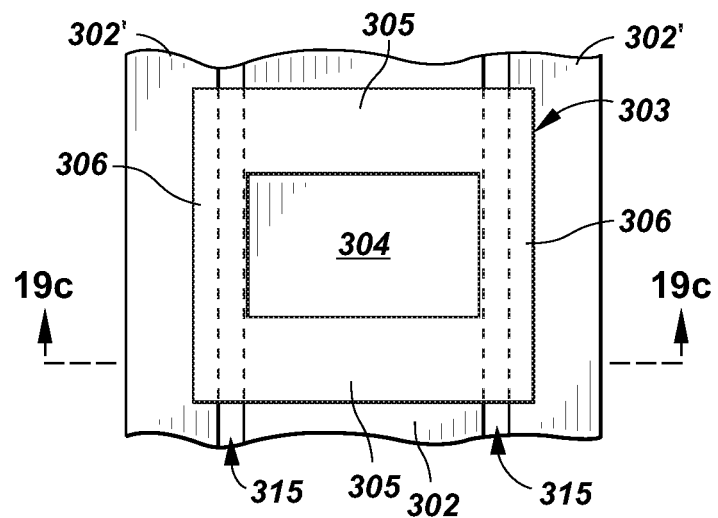
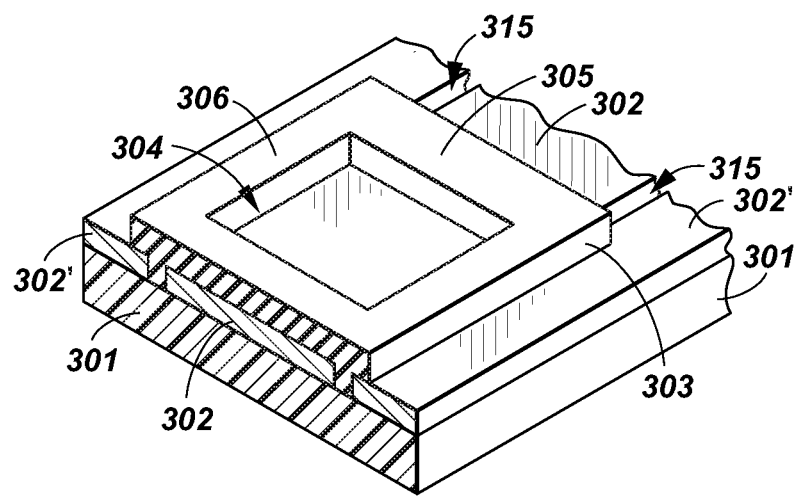
FIG. 19b
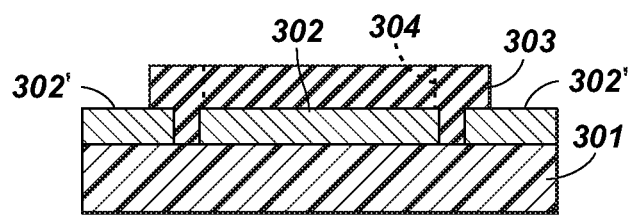
FIG. 19c

METHOD FOR MASK-FREE OLED DEPOSITION AND MANUFACTURE

CROSS REFERENCE TO RELATED APPLICATION

This application claims the benefit of U.S. Provisional Application No. 62/621,616, filed Jan. 25, 2018.

GOVERNMENT INTEREST

This invention was made with Government support under Award DE-FOA-0001613 by the US Department of Energy under the title of 'Mask-Free OLED Fabrication Process for Non-Tunable and Tunable While OLED Panels'. The Government has certain rights in this invention.

BACKGROUND

OLED lighting panels offer many advantages for general lighting purposes. They are efficient in terms of light output for power consumed. They are low voltage which helps avoid potential electrical shocks, less prone to sparking in potentially explosive environments and reduce loads in the supporting electrical system. The spectrum of emitted light can be varied using appropriate internal designs. They produce little or no UV or IR light. They are instant on; that is, they emit light immediately whenever electrical power is supplied. OLED light sources are inherently flat area light sources. They offer several advantages over LED lighting panels. They can be made even thinner (for example, less than 1 mm thick) and they produce very little heat under normal operating conditions. However, OLED lifetimes can be an issue. Both LED and OLED lighting panels can be made on flexible or curved substrates even though OLED is preferred for these types of applications. In summary, OLED lighting panels can be useful as lighting panels. They are efficient, low voltage, cool to the touch, and are thin. Luminaires (a complete unit with a light source (i.e. a lamp) and a support unit (i.e. a lampholder) that provides light and illumination) can be designed to utilize flat or curved OLED lighting panels.

Although OLED lighting panels have many desirable properties over LED panels, they currently have significantly higher manufacturing costs. In order to increase the penetration of lighting markets and make OLED lighting more cost-competitive to LED lighting, there is a great need for improved manufacturing processes that will lower overall OLED manufacturing costs.

In general, white light emitting OLED panels have multiple organic layers which are responsible for light emission between two electrodes of opposite charge; all located on a substrate. One of the electrodes must be at least semi-transparent. When power is supplied to the electrodes, light is emitted. Because the organic layers are sensitive to air and water, the OLED must be encapsulated; however, electrical connections to the electrodes must still penetrate through the encapsulation.

Because OLEDs are composed of multiple overlapping layers of different materials on a substrate, each layer must be deposited separately and so, the manufacture of the entire OLED requires a large number of steps to complete the device. No matter what kind of deposition method is used, it is very desirable to have an in-line production machine where a raw substrate is completely converted to a finished OLED in order to minimize costs. However, because it is necessary to deposit multiple layers, some of which may be patterned, there will generally be many stations along the manufacturing line, each dedicated to a specific step or group of steps. This leads to a complicated equipment line and high capital costs.

One general method for depositing the organic OLED layers is by vapor deposition under high vacuum. Inorganic layers such as metal oxides or metals can generally be deposited by vapor deposition as well as sputtering techniques which also require high vacuum.

Vapor deposition is based on heating the material(s) to be deposited under high vacuum and directing the resulting vaporized material onto the deposition surface. This creates a layer of the materials(s) that are generally free from contamination. The organic materials must be thermally stable at their vaporization temperature. However, this method is wasteful in terms of the amount of material actually deposited which leads to higher costs since the OLED materials can be very expensive. Moreover, the rate of material deposition can be relatively slow leading to long manufacturing times. Finally, the high vacuum equipment required for this method is complex, difficult to maintain and expensive. For sputtering or vacuum deposition, shadow masks can be used if patterning is necessary.

Even in the simplest OLED structures, at least some layers must be patterned. In particular, for current vapor deposited OLEDs, there is a need for at least two sets of shadow masks. The first mask is for the OLED organic evaporation, to prevent deposition in the encapsulation seal area surrounding each panel. Organic materials deposited in the seal allow a path for moisture to diffuse into the lit area, causing dark spots and edge growth. The second mask is for the cathode evaporation, preventing the cathode layer from contacting the anode contact areas, which would cause a short circuit of the OLED.

For OLED lighting panels, uniformity of emission is very important. This requires that the charge delivered to the electrodes is even across the device. Typically, there are contact areas or pads outside the encapsulation that are in electrical contact with the internal OLED electrodes. In some cases, it is sufficient that there is a single point of electrical contact to each of the electrodes. In such cases, it is desirable that the two contact areas are located on the same side of the device, although they must be separated by an insulating gap in order to prevent shorting. In other cases, it is sufficient that the contact areas are located along the entire side of the device; for example, the contact pads for one electrode lie along the entire side of two opposing sides of the device, while the contact pads for the other electrode lie along the entire side of the other two opposing sides of the device. Finally, in some cases, each of the sides of the device would have at least two contact pads—one for each electrode and separated by an insulating gap. Such designs all require patterning of both electrodes.

Moreover, in sheet-to-sheet type processes where individual sheets of substrates are transferred from station to station on carriers, changing masks between the organic and cathode layer deposition requires an in-vacuum robot to move the substrates from the organic-deposition carriers to the cathode-deposition carriers. Lifting the masks or moving the substrates can create particles at a very sensitive stage in the manufacturing process. Particles can result in short circuits in the OLED panels both when initially lit, which reduces manufacturing yields.

One way to minimize costs and decrease of complexity of the equipment is to use a "roll-to-roll" system. In a "roll-to-roll" system, a flexible substrate is mounted on a roll on one end of the equipment, then is unrolled and passed through, as a continuous web, the various processing stations to add the OLED layers, and the finished OLED is then rolled up on the end of the equipment. This would require the use of a flexible substrate that would be stable to the various processing steps and be air and water impermeable (since it would be part of the final encapsulation). However, it avoids the complexity of trying to transport a rigid substrate (which necessarily would be in separate, non-continuous sections) throughout many stations. Hybrid systems using individual rigid substrates temporarily mounted on a flexible moving web are known.

For at least these reasons, it would be desirable to develop an in-line OLED manufacturing process which avoids or minimizes the number of masking steps, preferably in a roll-to-roll process. Not only would the production equipment be less complex, easier to maintain and have lower capital costs, elimination of shadow masks would lead to still lower costs as well as avoiding mask cleaning. However, even partial elimination of the number of steps requiring shadow masking would still be very advantageous for manufacturing OLEDs. This would apply to any continuous process including "roll-to-roll" on flexible substrates as well as processes using rigid substrates.

As mentioned previously, the OLED needs to be encapsulated by air and moisture proof materials. This can be problematic in a "roll-to-roll" process where a completely finished and fully encapsulated OLED panel is the end product of the production line. This is because while the raw substrate is a continuous roll, the OLED panel is not and will have a finite length. This means that at some point in the overall process, it will be necessary to cut the substrate and its overlying layers perpendicular to the length of the continuous web. This will create side edges of the layers which must be encapsulated. Thus, in such processes, the unfinished OLED web is cut before encapsulation and then encapsulated in a later process. This adds complexity and cost back into the manufacturing process. For this reason, it would be desirable to allow for an encapsulation process directly on the continuous OLED web where when the OLEDs are cut into individual sections, the side edges of the various layers are not revealed and remain encapsulated.

Encapsulation of the OLED must surround the OLED on all sides; top, bottom and all sides. This can be problematic in any continuous roll-to-roll process since at least some of the encapsulation must run across the width of the roll (transverse to the direction of travel) as well as along its length. It would be necessary to stop the roll in order to build any sort of transverse structures. Hence, a desirable process would minimize the time spent stopped to perform transverse operations.

Encapsulation requires that the sealing regions be free from organic materials. While deposition of organic materials in the sealing regions can be avoided using shadow masks, it would be very desirable if the shadow masks could be eliminated.

U.S. Pat. No. 8,853,664 describes a method for roll-to-roll manufacturing of OLEDs. A pattern of the lower electrode (anode) is created on a flexible support, organic OLED layers are deposited over the patterned electrode and then a portion removed by etching on one side of the lower electrode. An upper electrode is then deposited over the remaining organic layer and then a portion is removed by etching on a side opposite to the exposed lower electrode. The active area can be encapsulated leaving the exposed sections of the lower and upper electrodes as contact pads.

WO2015129892 describes a process of making OLEDs in a roll-to-roll process by patterning an anode on a substrate followed by a patterned anode lead-out and a patterned cathode lead-out. An insulating layer (which can be inorganic) is then patterned partially over the anode and anode lead-out. This is followed by a blanket deposition of organic layers. Then, laser ablation is used to remove the organic layer to expose the insulating layer and the cathode lead-out. The cathode is then deposited over everything, followed by a sealing layer and an organic protective layer. Then, laser ablation is again used to remove the protective layer, sealing layer, and cathode over the tag end of the anode lead-out and cathode lead-out.

WO2016103889 describes a process of making OLEDs in a roll-to-roll process by patterning an anode on the substrate, patterning organic layers over the anode and patterning a cathode over the organic layers. Then, the organic layers are removed by dry etching using the cathode as a mask. This exposes the anode contact pads. The active areas are then encapsulated using thin-film encapsulation.

U.S. Pat. No. 8,704,443 describes EL devices which can be made by a roll-to-roll process. Active organic layers and a cathode layer are uniformly deposited over a flexible impermeable support. Over the active organic layers is deposited a patterned insulating layer (may be organic or inorganic). Over the insulating layer is deposited a metal auxiliary anode layer. Over the exposed active organic layers, the insulating layer and the metal auxiliary layer is deposited an anode. There is encapsulation, attached via adhesive, over the device.

U.S. Pat. No. 9,209,366 describes a process of manufacturing encapsulated OLEDs with having two barrier layers, one organic and one inorganic between the upper electrode and the encapsulation. Also described is patterning some of the active OLED layers by dry etching so that the lower electrode remains exposed. There are electrode contact pads surrounding the encapsulated active areas of the OLED.

U.S. Pat. No. 8,871,563 describes the formation of subsidiary electrodes by patterning a metal layer on a transparent substrate, patterning an insulation layer over the metal layer and then etching to expose the top surface of the metal layer. An anode is then deposited over the metal layer/insulating layer.

US20160133868, US20050023970, U.S. Pat. Nos. 9,313,835, 8,071,999 and 8,836,204 describe various processes for forming rectangular planar lighting devices with electrical contacts located along the edges outside the encapsulation.

U.S. Pat. No. 8,664,023, US20160308131 and US20150179986 describe various methods for manufacturing OLEDs in a roll-to-roll process by vapor deposition. The processes use shadow masks.

US20130240867, U.S. Pat. Nos. 6,351,067, 6,617,054 and 5,981,092 describe the use of an inorganic layer over an anode.

U.S. Pat. No. 7,271,012 describes laser ablation of organic layers over electrical leads in IC devices. US20050019977 describes a process for manufacturing OLEDs using dry etching to remove organic materials over conductive leads.

Color tunable or controllable OLED lighting panels have been described for example, in U.S. Pat. Nos. 6,841,949, 9,142,595, WO2005109541 and US20160172330, Shen et al, Science, 276, 2009 (1997) and Liang et al, J. Organomet. Chem, 694, 2712 (2009). Intermediate electrodes have been described for example, in U.S. Pat. Nos. 5,917,280, 8,680,693, US20160164046 and US20160072069.

SUMMARY

A first method for making an OLED lighting panel on a substrate having length and width dimensions comprising the steps of: patterning a first electrode layer over the substrate so that some portions of the substrate are not covered by the first electrode layer; patterning an inorganic insulation layer at least partially over the first electrode layer such that: a) the inorganic insulation layer surrounds an enclosed area of the first electrode layer where portions of the inorganic insulation layer are in the width dimension and have at least one horizontal thickness $HT_{W\text{-}iil}$ and portions of the inorganic insulation layer are in the length dimension and have at least one horizontal thickness b) where at least part of one of the portions in the length or width dimension has a horizontal thickness that is greater than at least part of the same or other dimension; and c) the inorganic insulating layer is arranged such that at least some part of the first electrode layer lies outside the enclosed area adjacent to the portion(s) of inorganic insulation layer whose horizontal thickness is greater and at least some part of the substrate lies outside the enclosed area adjacent to the portion(s) of inorganic insulation layer whose horizontal thickness is less; depositing at least one organic layer for light emission over the length and width of the substrate; removing the at least one organic layer over a sealing region; the sealing region being located in part over the inorganic insulation layer wherein: a) the horizontal thickness of at least one portion of the sealing region ($HT_{W\text{-}s}$ or $HT_{L\text{-}s}$) is less than the at least one portion of the horizontal thickness of the inorganic insulation layer ($HT_{W\text{-}iil}$ or $HT_{L\text{-}iil}$) so that the least one portion of the sealing region lies entirely over at least one of the portions of the inorganic insulation layer whose horizontal thickness is greater; and b) where at least another portion of the sealing region ($HT_{W\text{-}s}$ or $HT_{L\text{-}s}$) lies partially over the portion of inorganic insulation layer ($HT_{W\text{-}iil}$ or $HT_{L\text{-}iil}$) whose horizontal thickness is less and partially over at least the part of the substrate located on the opposite side from the enclosed area; and depositing a second electrode over the length and width of the substrate.

In some embodiments of the above method where the horizontal thickness of the two portions of the inorganic insulating layers are different depending on whether they are adjacent to the first electrode layer or substrate, the horizontal thickness of the sealing region may be the same ($HT_{W\text{-}s}=HT_{L\text{-}s}$) throughout or different ($HT_{W\text{-}s}{\neq}HT_{L\text{-}s}$) either in the same or different dimensions.

A second method for making an OLED lighting panel on a substrate having length and width dimensions comprising the steps of: patterning a first electrode layer over the substrate so that some portions of the substrate are not covered by the first electrode layer; patterning an inorganic insulation layer at least partially over the first electrode layer such that: a) the inorganic insulation layer surrounds an enclosed area of the first electrode layer where the inorganic insulation layer in the width dimension and the inorganic insulation layer in the length dimension both have the same horizontal thickness ($HT_{W\text{-}iil}=HT_{L\text{-}iil}$); and b) the inorganic insulating layer is arranged such that at least some part of the first electrode layer lies outside the enclosed area adjacent to the portion(s) of inorganic insulation layer in one dimension and at least some part of the substrate lies outside the enclosed area adjacent to the portion(s) of inorganic insulation layer in the other dimension; depositing at least one organic layer for light emission over the length and width of the substrate; removing the at least one organic layer over a sealing region; the sealing region located in part over the inorganic insulation layer and having at least one horizontal thickness $HT_{W\text{-}s}$ in the width dimension and at least one horizontal thickness $HT_{L\text{-}s}$ in the length dimension, wherein: a) at least one portion of $HT_{W\text{-}s}$ is different from $HT_{L\text{-}s}$; b) where at least some part of the first electrode layer is outside the enclosed area adjacent to a portion of inorganic insulation layer, the sealing region lies entirely on the inorganic insulation layer and the horizontal thickness of the sealing region ($HT_{W\text{-}s}$ or $HT_{L\text{-}s}$) is such that it is less than the horizontal thickness of the underlying inorganic insulation layer ($HT_{W\text{-}iil}$ or $HT_{L\text{-}iil}$) so that the portions of the sealing region lie entirely over the portions of the inorganic insulation layer adjacent to the first electrode layer; and c) where at least some part of the substrate is outside the enclosed area is adjacent to a portion of inorganic insulation layer, the horizontal thickness of the sealing region ($HT_{W\text{-}s}$ or $HT_{L\text{-}s}$) is such that the sealing region lies partially over the portions of the inorganic insulation layer and at least partially over at least part of the substrate; and depositing a second electrode over the length and width of the substrate.

One difference between the first and second methods is that in the first method, the horizontal thicknesses of the inorganic insulation layer is not constant and the horizontal thickness of the sealing region may or may not be constant, whereas in the second method, the horizontal thickness of the inorganic insulation layer is constant throughout and the horizontal thickness of the sealing region is not constant. In both of these methods, removal of the organic layers over the top of inorganic insulation layer surrounding the enclosed area along with a portion of the substrate adjacent to the enclosed area forms a sealing region, suitably free from organic materials, for encapsulation.

Some further embodiments suitable for both methods may include all or some of the following additional steps or have the following features:

There can be a further step of depositing a passivating layer over the entire length and width of the second electrode.

There can be a further step of depositing thin-film encapsulation or lamination-type encapsulation over at least the enclosed area and sealing region. There can be more than one enclosed area on a single substrate and a further step after the encapsulation where the substrate is divided into at least two individual sections, each containing at least one encapsulated enclosed area.

The at least one organic layer can be removed from the sealing region by laser treatment.

The horizontal thickness of the sealing region can be constant along a single dimension or it may change along a single direction.

There can be at least one electrically conductive isolated pad over the substrate and separated from the first electrode layer by a gap and the inorganic insulation layer extends over the edge of the first electrode layer and at least partially over the gap and the second electrode makes electrical contact with the isolated pad.

There can be further steps where any overlying layers from the first electrode layer and second electrode outside the sealing region are removed.

The substrate can be flexible.

The organic layer(s) for light emission can be deposited by vapor deposition.

The second electrode can be deposited by vapor deposition or sputtering.

The OLED lighting panel can be prepared without the need for shadow masking for the deposition of the OLED organic layers or second electrode layer. This results in reduced manufacturing costs and higher manufacturing yield. The method is suitable for roll-to-roll processes.

BRIEF DESCRIPTION OF THE DRAWINGS

FIG. 1b is a perspective view of FIG. 1a.

FIG. 2b is a perspective view of FIG. 2a.

FIG. 3b is a perspective view of FIG. 3a.

For the 4$^{th}$ step of the first embodiment.

For the 5$^{th}$ step of the first embodiment.

For the optional 6$^{th}$ step of the first embodiment.

FIG. 11a is a top view of the first step of a second embodiment. FIG. 11b is a perspective view of FIG. 11a.

FIG. 12b is a perspective view of FIG. 12a.

FIG. 13a is a top view of the third step of the second embodiment. FIG. 13b is a perspective view of FIG. 13a.

FIG. 16b is a perspective view of FIG. 16a.

FIG. 17b is a perspective view of FIG. 17a.

FIG. 18b is a perspective view of FIG. 18a.

FIG. 19a is a top view of the second step of the 4$^{th}$ embodiment. FIG. 19b is a perspective view of FIG. 19a. FIG. 19c is a cross-sectional view along the length direction.

FIG. 20b is a perspective view of FIG. 20a.

Figure 1A:
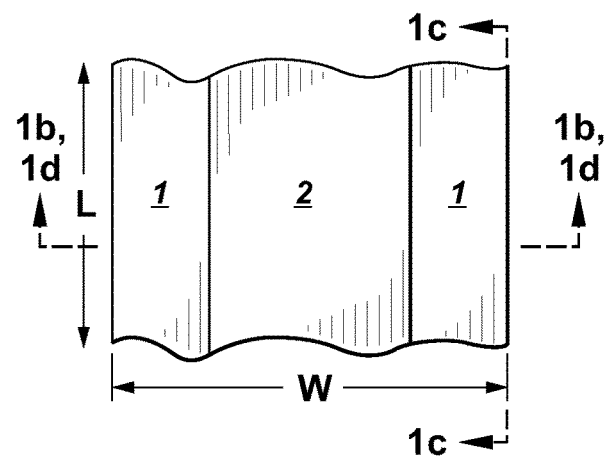
FIG. 1a is a top view of the first step of a first embodiment.

The drawings are for illustrative purposes. They are not to scale. The relative dimensions of the various structures and layers within the drawings are also not to scale, either within the same drawing or between different drawings.

DETAILED DESCRIPTION

The method is ideally used for in-line roll-to-roll process. Generally speaking, a roll-to-roll process involves a roll of flexible substrate at the beginning of the manufacturing line, which then is unspooled through the various coating steps as a continuous web and upon completion, is spooled up as a final roll. Ideally, the entire process would start with a roll of raw substrate at the beginning and the finished OLED panels as the final roll, needing only separation into individual panels. However, in practice, a roll-to-roll process might involve only a few steps of the entire process. In some embodiments, it could be divided up into a series of multiple separate roll-to-roll operations. For example, a substrate could be coated with the patterned first electrode and the patterned inorganic insulation layer in one operation and then the roll transferred to another manufacturing line where the organic layers, formation of the sealing region, and second electrode and the remainder of the steps are completed in a second roll-to-roll process. In addition, a combination of a roll-to-roll process and a batch operation or a sheet-to-sheet operation could be combined. For example, all of steps prior to encapsulation could be performed in a roll-to-roll operation, then the partially finished substrate cut into individual sheets for final encapsulation in a batch operation or by individual sheets in an encapsulation station. A roll-to-roll type process would also include processes where individual pre-formed sheets of substrate (flexible or rigid) are temporarily attached to a continuous web to transport the substrates through the in-line manufacturing equipment. The method can also be applied to a sheet-to-sheet process using individual sheets of substrate which are mechanically transported through the various operations.

In the following descriptions, reference will be made to length and width dimensions which are directional. In terms of the substrate, the length dimension lies along the longest axis and the width dimensions lies along the shortest axis. For example, if the substrate is rectangular or is in the form of a roll, the length dimension is along the longer edges and the width dimension, which is perpendicular to the length dimension, is along the shorter edges and across the substrate. When discussing layers and structures on the substrate, their length and width dimensions will correspond to the length and width dimensions of the substrate, even though the layers and structures may not fully extend across those dimensions. It should be noted that while the layers and structures will have an orientation in the width or length dimension, in some instances, it is important that the layers and structures have physical dimensions configured to have a certain width (across the shortest edge-to edge) or length (across the longest edge-to-edge). These physical dimensions are independent of the directional dimensions. To avoid confusion, the physical dimensions of the layers and structures will be referred to as horizontal thickness (parallel to the plane of the substrate) or vertical thickness (perpendicular to the plane of the substrate).

The contact pads for electrical connection to the electrodes within the encapsulated OLED may each lie along a different side of the device or may be located together on the same side of the device, although in all cases, they must be electrically separated from each other. A contact pad may be an extension of the electrode itself or may be an additional conductive layer in electrical connection to the electrode, and will be located outside the encapsulation of the device. FIGS. 1-10 describe a first embodiment where the contact pads for the one of the two electrodes lie along two sides of the completed encapsulated device and the contact pads for the other electrode lie along the opposite two sides.

Figure 1B:
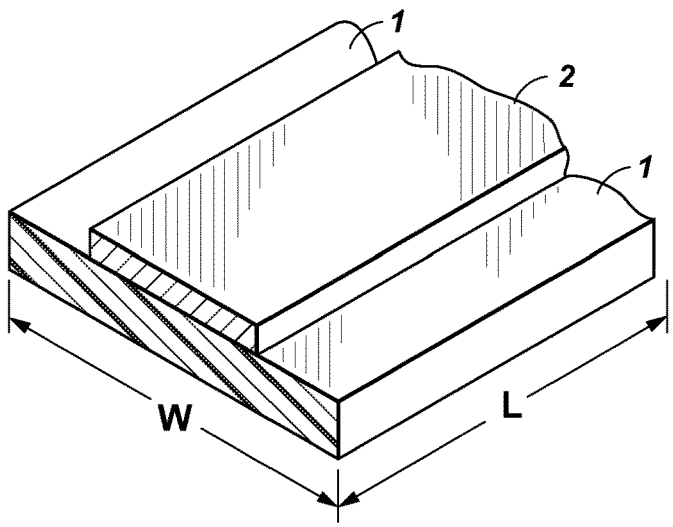
Figure 1C:
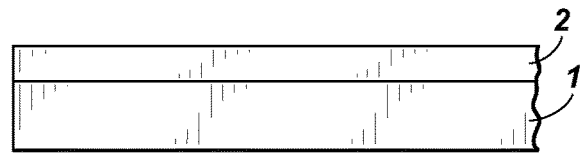
FIG. 1c is a cross-sectional side view in the length direction.
Figure 1D:
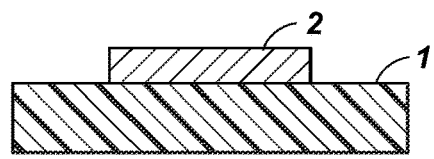
FIG. 1d is a cross-sectional side view in the width direction.

FIG. 1a shows a top view of a substrate 1 on which a patterned layer of first electrode has been deposited. FIG. 1b shows a perspective view of FIG. 1a. FIGS. 1a and 1b also indicate the length (L) and width (W) dimensions of the substrate. FIG. 1c shows a cross-sectional view in the width direction and FIG. 1d in the length direction. As can be seen in FIG. 1b, the cross-sectional faces of the first electrode 2 and substrate 1 would be in the same vertical plane in the length direction (i.e. FIG. 1c) but these faces would be offset vertically in the width direction. In this first embodiment, the horizontal thickness of the patterned first electrode layer is smaller than the horizontal thickness of the substrate so that some of the top surface of substrate 1 along both sides is left uncovered by the first electrode 2.

Figure 2A:
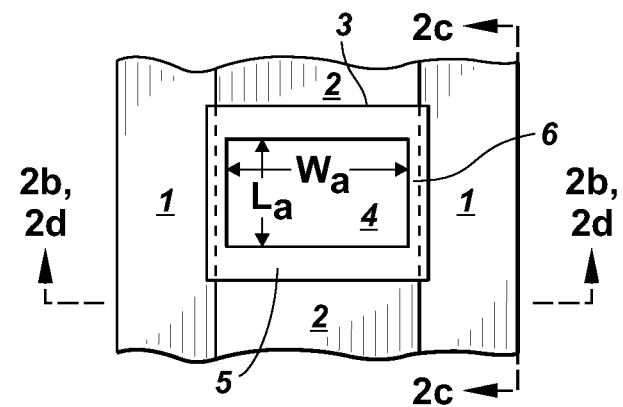
FIG. 2a is a top view of the second step of the first embodiment.
Figure 2B:
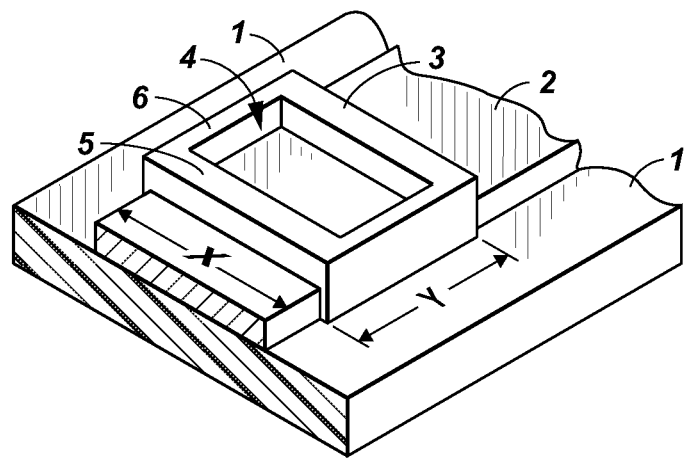
Figure 2C:
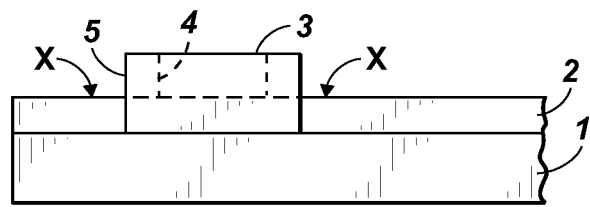
FIG. 2c is a cross-sectional side view in the length direction.
Figure 2D:
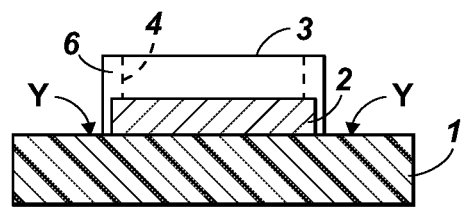
FIG. 2d is a cross-sectional side view in the width direction.

FIG. 2a shows a top view of substrate 1/first electrode 2 as shown in FIG. 1a on which an inorganic insulation layer 3 has been patterned. The pattern forms an enclosed area 4 which has an interior width ($W_a$) and a length ($L_a$). The width ($W_a$) of the enclosed area runs in the same dimension as the width of the substrate and the length ($L_a$) of the enclosed area runs in the same dimension as the length of the substrate. The inorganic insulation layer 3 thus forms first and second portions around the enclosed area 4. The first portions of the inorganic insulation layer 3 are those that lie along the width dimension and the second portions are those that lie along the length dimension. Within the enclosed area is the top surface of the first electrode 2. Thus, the enclosed area 4 forms a "well" which is surrounded on all sides by walls of the inorganic insulating layer 3 and where the bottom is the first electrode 2. However, the horizontal thickness of the walls formed by the inorganic insulation layer 3 are not the same throughout. FIG. 2b shows a perspective view of FIG. 2a. FIG. 2c shows a cross-sectional side view in the width direction and FIG. 2d is the side view in the length direction.

The first portions of the inorganic insulation layer 3 that defines the width of the enclosed area ($W_a$) and lie along the width dimension are designated as 5 and have a horizontal thickness $HT_{W\text{-}iii}$. The second portions of the inorganic insulation layer that define the length of the enclosed area ($L_a$) are designated as 6 and have a horizontal thickness $HT_{L\text{-}iii}$. In this particular embodiment, $HT_{W\text{-}iii}$ is the same for both first portions 5 but are greater than $HT_{L\text{-}iii}$ for both second portions 6. Note that first portions 5 are adjacent to the first electrode layer 2 on the opposite side from the enclosed area layer 4 which is indicated in FIGS. 2a and 2b by X. Note that second portions 6 are adjacent to the substrate 1 on the side on the opposite side from the enclosed area layer 4 which is indicated in FIGS. 2a and 2b by Y.

In the embodiment shown in FIGS. 2a and 2b, the outer edges of inorganic insulation layer portions 6 extend over and cover the vertical side faces of first electrode 2 on which the inorganic insulation layer portions 6 are located. This overlap can also be seen in FIG. 2d. This is necessary to prevent short circuiting between the second electrode and the first electrode in later steps. Thus, the portions 6 of the inorganic insulating layer 3 should be longer and extend past the edges of the first electrode so that the vertical face of the first electrode 2 is covered along portion Y of the substrate 1.

FIGS. 3a-3d shows a set of views (as in FIGS. 1a-1d and 2a-2d) where the organic layer(s) for light emission 7 have been vapor deposited over all of the exposed surfaces of the inorganic insulation layer, the first electrode and the substrate. There is no patterning of the organic layer(s) and the deposition occurs uniformly over the top of all structures. In particular, the organic layer(s) 7 are deposited within the enclosed area 4 where they are in contact with the first electrode 2, over the top of the inorganic insulation layer 3, that portion of the first electrode 2 that lies outside of the enclosed area 4 and the substrate 1. In particular, the organic layers(s) 7 are deposited within the "well" 4 as well as on top surface of the surrounding walls 5, 6 of the inorganic insulation layer 3. It should be understood that in FIGS. 3a-3d and all of the remaining Figs, any layers deposited uniformly without patterning will lie along the top of the walls 5, 6 of the inorganic insulation layer 3 as well as along the bottom of the enclosed area 4. It may not be possible in all views to show the layers within the enclosed area.

Figure 3A:
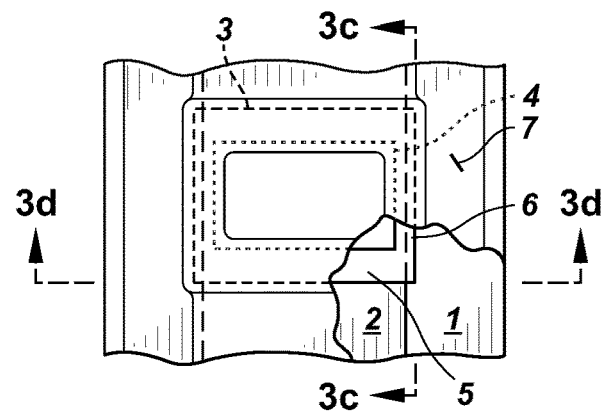
FIG. 3a is a top view of the third step of the first embodiment.
Figure 3B:
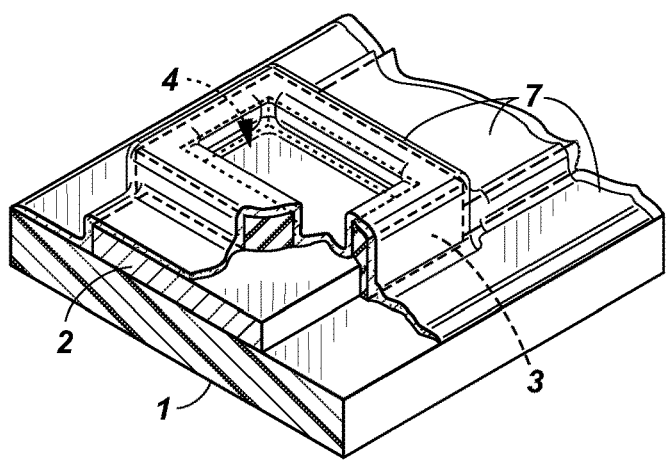
Figure 3C:
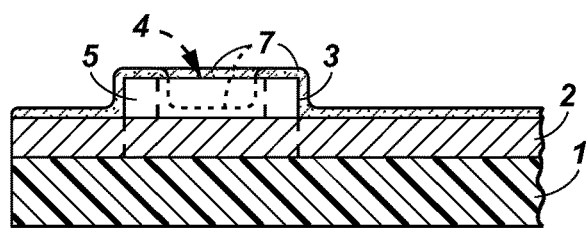
FIG. 3c is a cross-sectional view in the length direction.
Figure 3D:
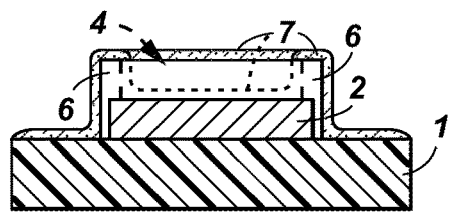
FIG. 3d is a cross-sectional view in the width direction.
Figure 4A:
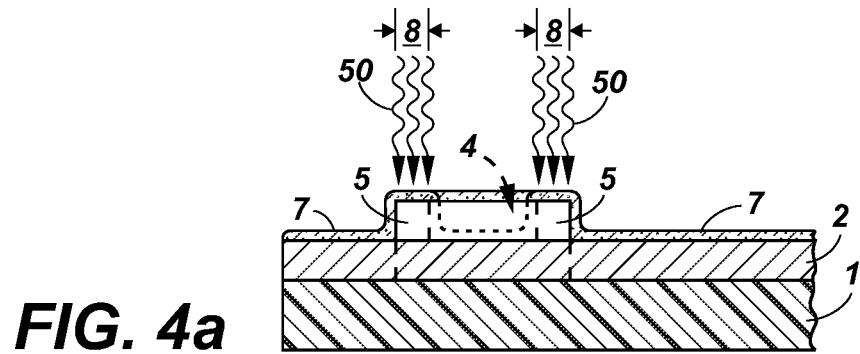
FIG. 4a is a cross-sectional side view in the length direction (same view as FIG. 3c) showing the formation of the sealing region.
Figure 4B:
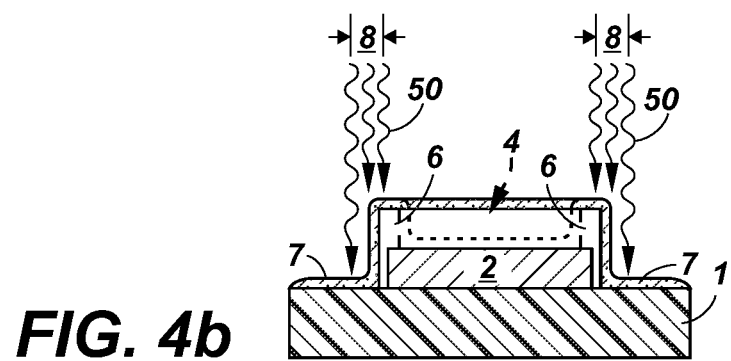
FIG. 4b is a cross-sectional side view in the width direction (same view as in FIG. 3d) showing the formation of the sealing region.
Figure 4C:
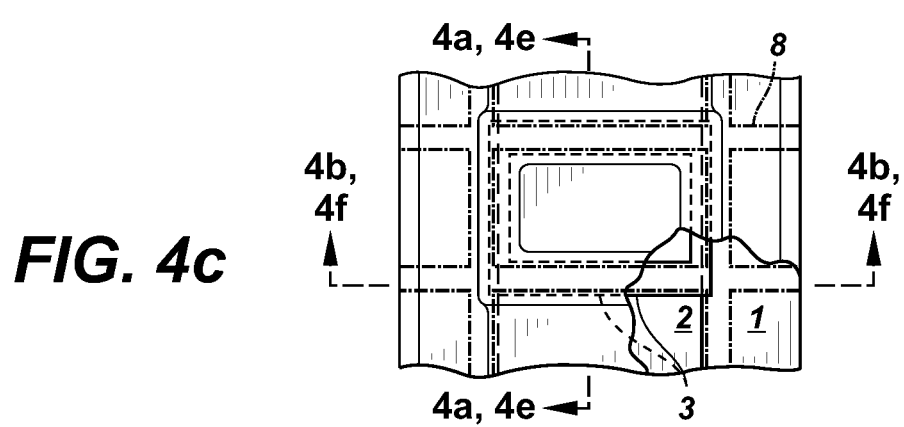
FIG. 4c is the top view indicating the location of where the sealing regions will be formed.

FIG. 4a shows the partially completed device of FIG. 3c where part of the sealing region 8 in the length direction is created by removal of the organic layer(s) 7, e.g. by laser treatment 50, over parts 5 of the inorganic insulation layer 3. The sealing region 8 lies entirely on top of portions 5 of the inorganic insulating layer 3. However, none of the organic layer(s) 7, e.g. by laser treatment 50, over the first electrode 2 in region X is disturbed. FIG. 4b shows the partially completed device of FIG. 3d where part of the sealing region 8 in the length direction is created by removal of the organic layer(s) 7, e.g. by laser treatment 50, over parts 6 of the inorganic insulation layer 3 and at least part of the substrate 1 in the region Y. In both directions, the sealing region 8 should be located so that on the side closest to the enclosed area, a small amount of organic material 7 remains along the top edge of the portions 5, 6 of the inorganic insulation layer 3. This is to avoid any possibility of misalignment where the sealing region 8 would impinge into the enclosed area 4. FIG. 4c shows a top view illustrating the location of the sealing region in both the L and W directions. Note that the sealing region 8 is continuous in both the W and L directions around the top of the walls of the inorganic insulation layer 3.

Although the embodiment shown in FIG. 4c shows that the sealing region 8 extends across the full width dimension of the substrate 1, at a minimum, it is only necessary that these portions of sealing region 8 extend from one side of the inorganic insulation layer 3 to the other side in the width direction. Likewise, although FIG. 4c shows that the sealing region 8 extends along the full length of the substrate, at a minimum, it is only necessary that these portions of the sealing region extend from one side of the inorganic insulation layer 3 to the other side in the length direction. It is important to note that the horizontal thickness of the sealing region in the width dimension ($HT_{W-s}$) and the horizontal thickness in the length dimension ($HT_{L-s}$) may be the same (as shown in this embodiment) or different as desired.

In any case, in this embodiment, by proper choice of horizontal thickness of the sealing region 8 (which may or may not be the same in the length or width direction) and positioning, the organic layer(s) 7 are removed at least partially from the top of the inorganic insulation layer 3 in both the width and length directions around the enclosed area 4 and also from the top layer of the substrate 1 in region Y on the side of the enclosed area 4. This is enabled by having the horizontal thickness of the inorganic insulation layer portion 6 in the length direction being less than the horizontal thickness of portion 5 in the width direction. In this way, the sealing region 8 will be free from organic layer(s) that would render the eventual encapsulation of the enclosed region 4 ineffective. Moreover, because the sealing region 8 in part extends to the side of the enclosed area over the substrate 1, an area is created where the second electrode (added in a later step) can lie directly over the substrate 1 instead of over organic layer(s). This makes for a more robust contact area for external electrical connections to the second electrode. In addition, this allows electrical conductors patterned on the substrate before the OLED to make multiple connections to the second electrode from one external connection point on the substrate.

It should be noted (see FIGS. 4a-4c) that in this particular embodiment, both portion 5 of the inorganic insulation layer 3 which is adjacent to the first electrode 2 in region X (width dimension) and portion 6 of the inorganic insulation layer 3 which is adjacent to the substrate 1 in region Y (length dimension) have a constant horizontal thickness across the dimension, although different from each other. In this embodiment, the sealing region 8 has a constant thickness in both dimensions. However, this is not necessary. For example, the sealing region 8 could have a constant horizontal thickness along the width direction and have a horizontal thickness that varies along the length dimension. In such a case, the sealing region 8 could have the same horizontal thickness as in the width dimension for half of region Y and twice the horizontal thickness in the remaining half in region Y. This would create a narrower (in terms of length along the enclosed area) and extended (further away from the enclosed area) area of exposed substrate 1 where the second electrode will be located in a later step.

Figure 4D:
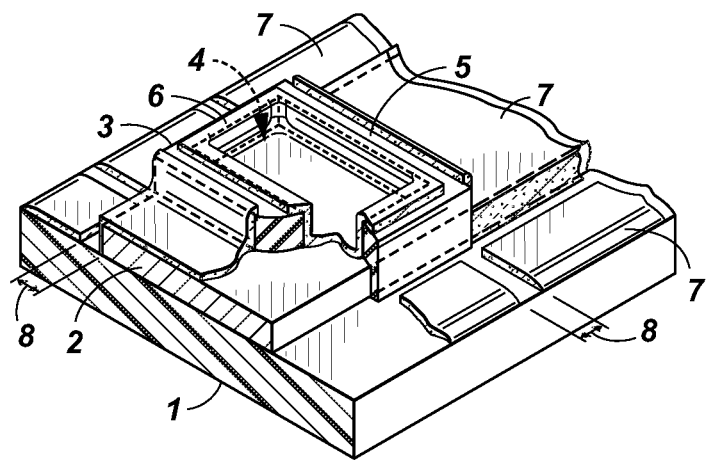
FIG. 4d is a perspective view (same view as in FIG. 3b) after the sealing region is formed.
Figure 4E:
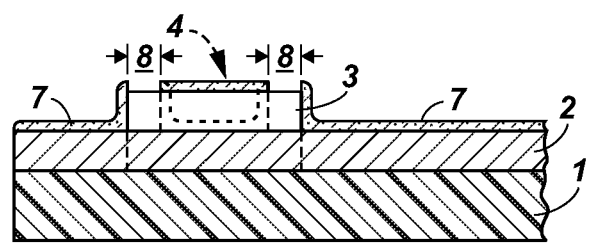
FIG. 4e is the cross-sectional side view as in FIG. 4a after the sealing region is formed.
Figure 4F:
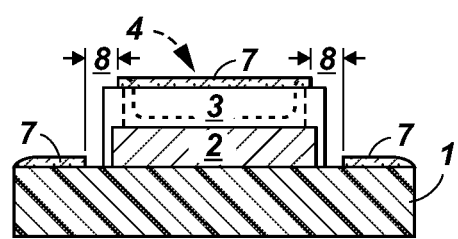
FIG. 4f is the cross-sectional side view as in FIG. 4b after the sealing region is formed.

FIG. 4d shows a perspective view according to FIG. 4c after the sealing regions 8 have been formed. FIG. 4e (corresponding to FIG. 4a) and FIG. 4f (corresponding to FIG. 4b) also show the sealing region 8 after removal of the organic layer(s) 7.

Figure 5A:
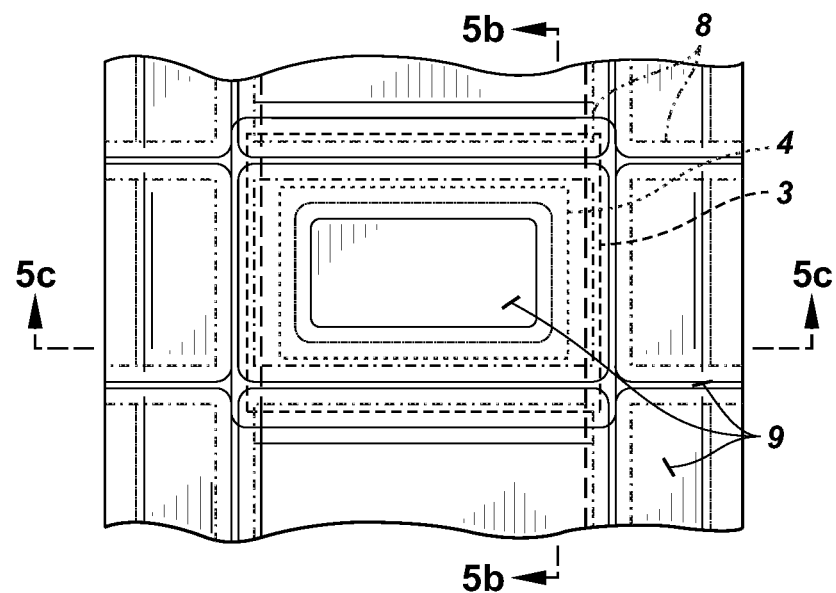
FIG. 5a is a top view.
Figure 5B:
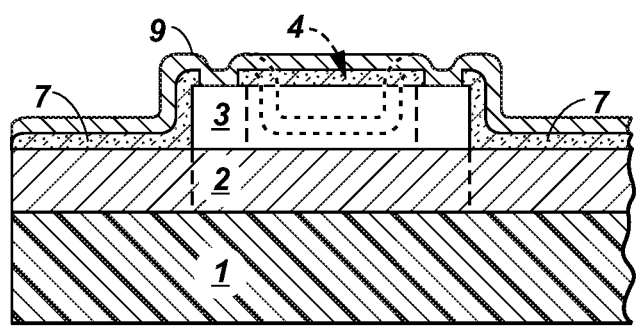
FIG. 5b is a cross-sectional side view in the length direction.
Figure 5C:
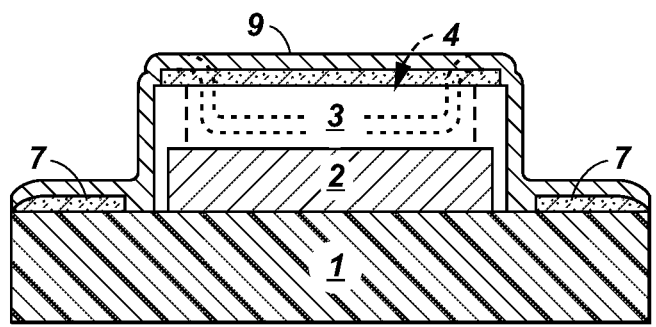
FIG. 5c is a cross-sectional side view in the width direction.

FIG. 5a is a top view after of the 5$^{th}$ step where a second electrode 9 has been deposited over all of the exposed surfaces of the substrate including the sealing region 8 and the organic layer(s). FIGS. 5b (width direction) and 5c (length direction) shows a set of cross-sectional views. There is no patterning of the second electrode 9 and the deposition occurs uniformly over the top of all structures. It does not matter if the second electrode 9 is located in the sealing region 8 since such conductive electrodes are inorganic (metals or metal oxides) and inherently impervious to air and moisture. Note that in FIG. 5c, there is no contact between the second electrode 9 and first electrode 2 in region Y because the inorganic insulating layer 3 extends past the edge of the first electrode 2 in this region and covers the vertical edge of first electrode 2.

Figure 6A:
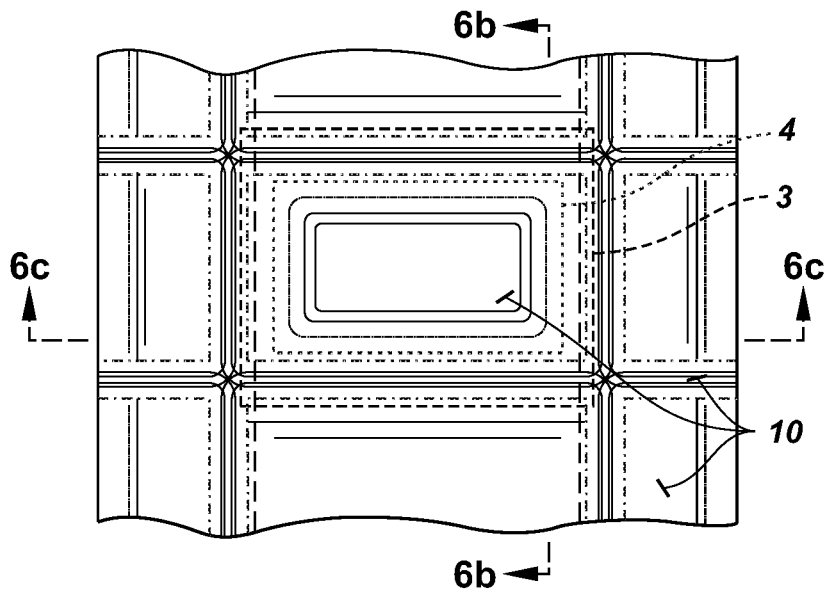
FIG. 6a is a top view, 6b is a cross-sectional side view in the length direction.
Figure 6B:
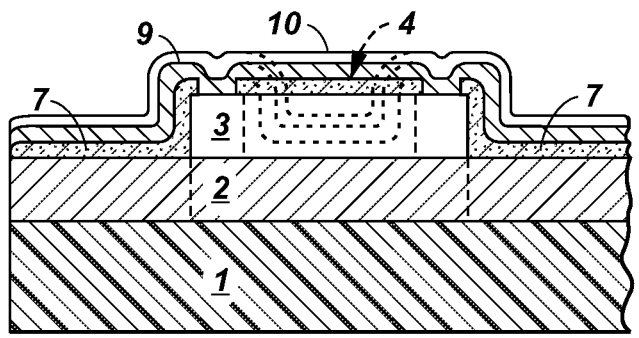
FIG. 6c is a cross-sectional side view along the width direction.
Figure 6C:
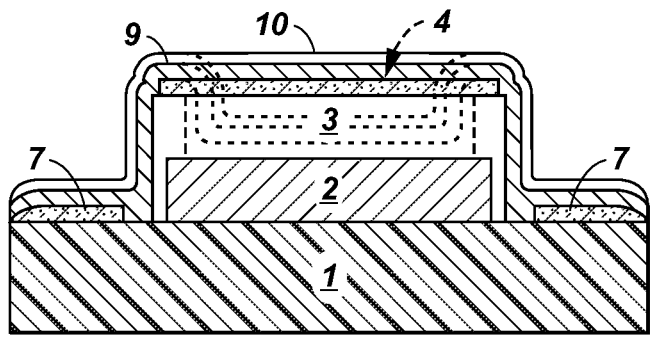

FIGS. 6a-6c shows a set of views where an optional passivating layer 10 has been deposited over all of the exposed surfaces of the substrate including the second electrode 9. There is no patterning of the optional passivating layer 10 and the deposition occurs uniformly over the top of all structures. The purpose of the passivating layer is to prevent damage to the second electrode if necessary. Since this layer will become part of the sealing region, it is highly desirable that this layer be inorganic. However, it is also possible to pattern the optional protective layer so that it is located only over the enclosed area and not within the sealing region. In this case, the protective layer can be inorganic or organic.

Figure 7A:
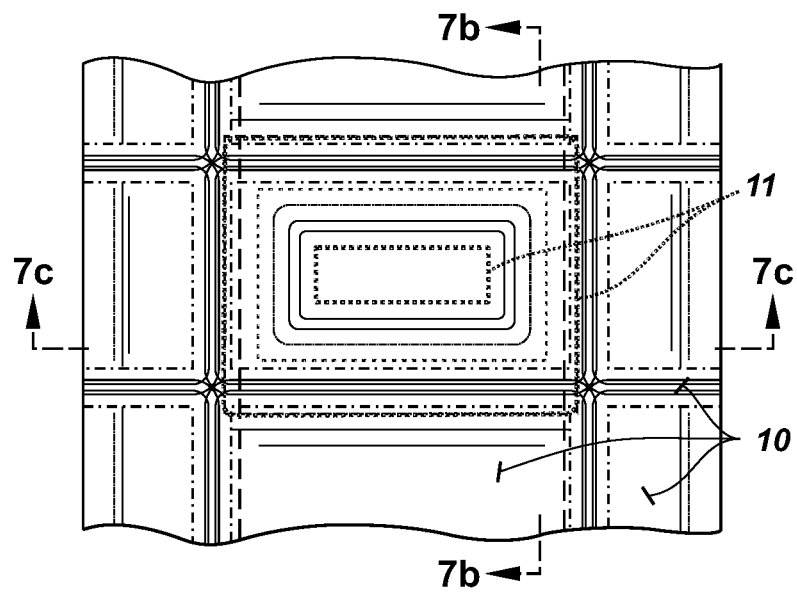
FIG. 7a is a top view of the 7$^{th}$ step of the first embodiment where encapsulation is located over the sealing region.
Figure 7B:
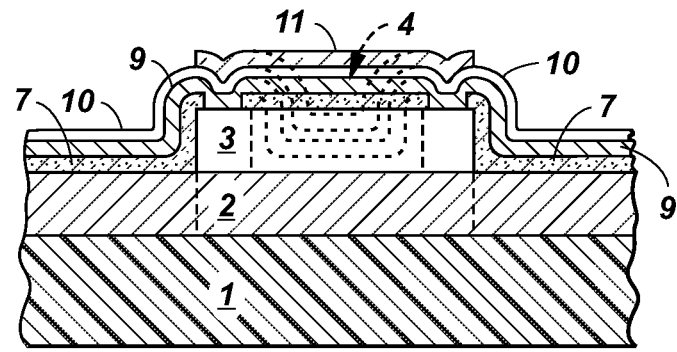
FIG. 7b is a cross-sectional side view in the length direction.
Figure 7C:
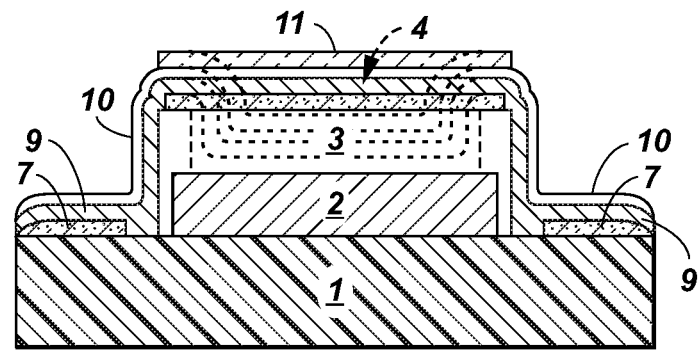
FIG. 7c is a cross-sectional side view in the width direction.

FIGS. 7a-7c shows a set of views where thin-film encapsulation 11 has been patterned over the enclosed area 4 and that part of the sealing region 8 which lies over the top of the walls of the inorganic insulating layer 3. While these figures show thin-film encapsulation 11 only extends to the outside edges of the sealing region 8 over the inorganic insulating layer 3 in both L and W directions, the encapsulation 11 can extend for some distance past the outside or even to the edge of the substrate 1. However, if the encapsulation extends over the external contact pads, then the encapsulation will need to be removed locally in order to expose the contact pads.

At this stage, the light-emitting OLED structure is contained within the enclosed area 4 and is fully encapsulated. However, the external contact pads for electrically contacting the first and second electrodes within the encapsulation are still covered by various layers. In particular, as shown in FIG. 7b, the external contact pads for the first electrode 2 are in region X and are covered by organic layers 7, second electrode 9, and optional protective layer 10. As shown in FIG. 7c, the external contact pads for the second electrode 9 are in region Y and may be covered by optional protective layer 10. These layers must be removed in both of these regions in order to complete the device.

Figure 8A:
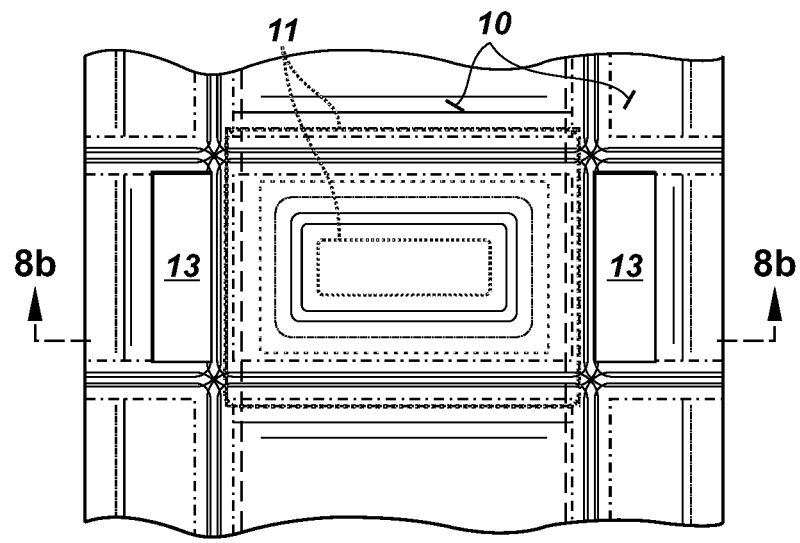
FIG. 8a is a top view of an additional step of the first embodiment (starting from FIG. 7c) after removal of the optional passivating layer over the contact pad for the second electrode.
Figure 8B:
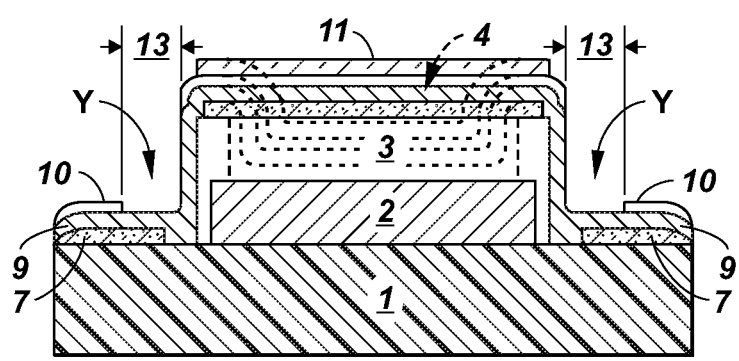
FIG. 8b is a cross-sectional side view in the width dimension.

FIGS. 8a and 8b shows a top view and a cross-sectional view of the area Y where the overlying layers have been removed to expose the second electrode 9 in the region Y. In this way, contact pads 13 for the second electrode 9 are exposed outside of the encapsulation. The exposed contact pads 13 for the second electrode 9 run along the sides of the enclosed area 4 in the length dimension. There may be an additional metal layer located over the exposed contact pad for the first electrode to increase its height above the substrate (for connection reasons) if necessary or improve electrical conductance and physical robustness.

Figure 9A:
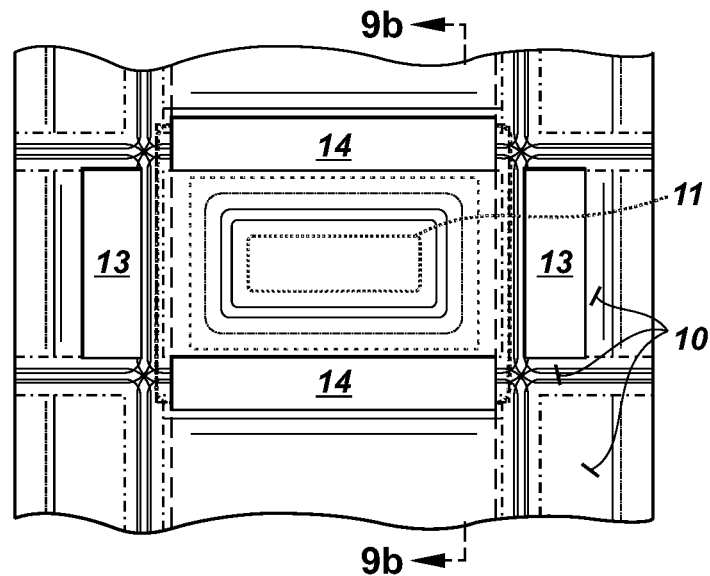
FIG. 9a is a top view of an additional step of the first embodiment (starting from FIG. 7b) after removal of the overlying layers over the contact pad for the first electrode.
Figure 9B:
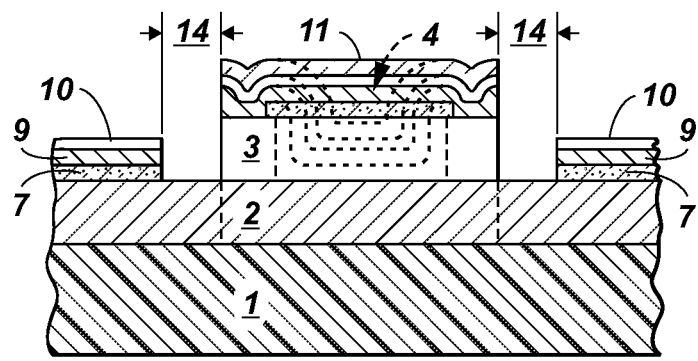
FIG. 9b is a cross-sectional side view along the length dimension.

FIGS. 9a and 9b shows a top view and a cross-sectional view of the area X where the overlying layers have been removed to expose the first electrode 2 in the region X. In this way, contact pads 14 for the first electrode 2 are exposed outside of the encapsulation. The exposed contact pads for the first electrode 2 run along the sides of the enclosed area 4 in the width dimension. There may be an additional metal layer located over the exposed contact pad for the first electrode to increase its height above the substrate (for connection reasons) if necessary or improve electrical conductance and physical robustness.

Figure 10:
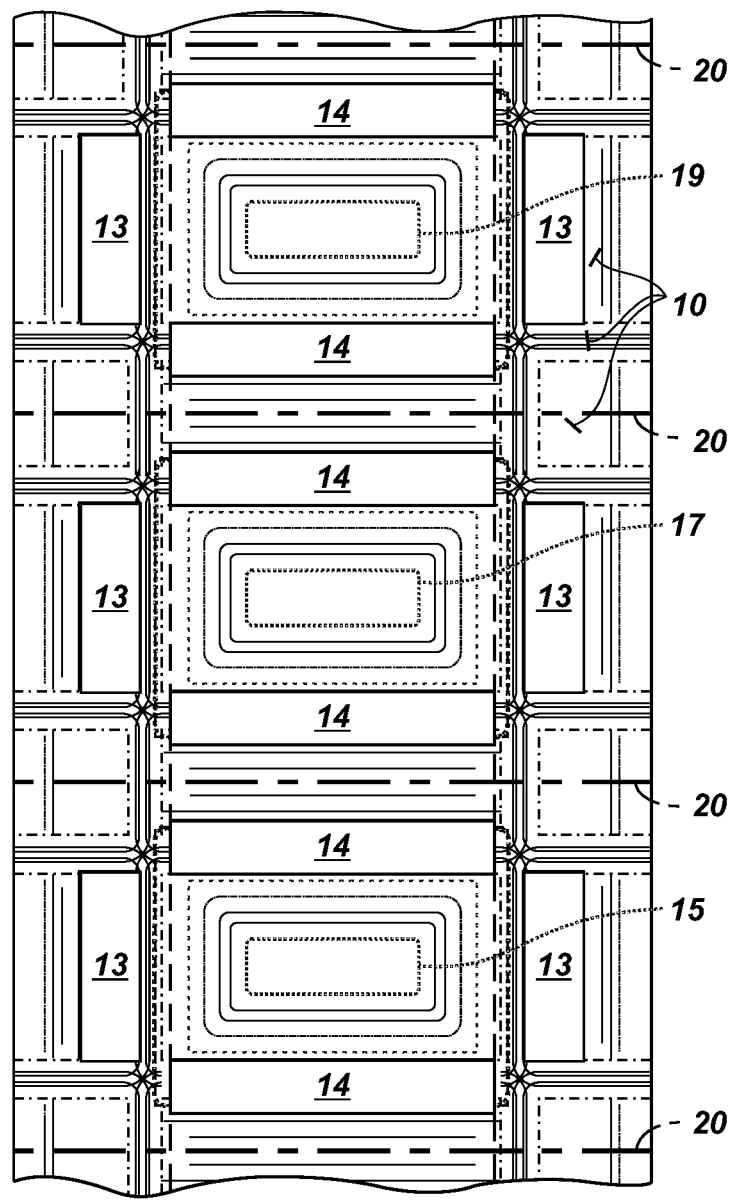
FIG. 10 is a top view of the first embodiment after both of the steps shown in FIGS. 8 and 9 are completed and illustrates the formation of multiple enclosed areas, each area forming a complete and independent OLED unit.

Note that the order of the steps in which the contacts pads 13, 14 for the first or second electrodes are exposed (as shown in FIGS. 8 and 9) is not important. Either may be come first. FIG. 10 shows a top view after both removal steps. Note that the contact pads 13, 14 for the first and second electrodes are not in contact with each. Each occupies opposite sides from the other; at the corners, each can be set back for a small distance to avoid incidental contact. This can be arranged by removal of the electrodes in these areas or by appropriate patterning of the first electrode in these areas during the first step.

FIG. 10 also illustrates the formation of multiple encapsulated enclosed areas 15, 17, 19, each being an independent fully encapsulated OLED unit with exposed contact pads for electrical connection, on a single substrate. The substrate can be cut along the dash-dot lines 20 between the individual areas to create individual lighting units.

The followings figures will describe a second embodiment in which the contact pads for the two electrodes lie along the same side of the completed encapsulated device.

FIG. 11a shows a top view of a substrate 101 on which a patterned layer of first electrode 102 has been deposited. FIG. 11a also indicates the length ($L_2$) and width ($W_2$) dimensions of the substrate. FIG. 11b shows a perspective view of FIG. 11a. The width of the patterned first electrode layer is smaller than the width of the substrate so that some of the top surface to the surface of the substrate 101 is uncovered by the first electrode 102 running along the length of the substrate. Desirably, the first electrode 102 is located so that there is some uncovered surface of the substrate 101 running along both sides of first electrode 102 in the length direction as shown. The edges of the patterned first electrode 101 in the length dimension are not linear but has large cut-out areas 130 that alternate along either side. There are also alternating smaller cut-out areas 140 as well.

Figure 12A:
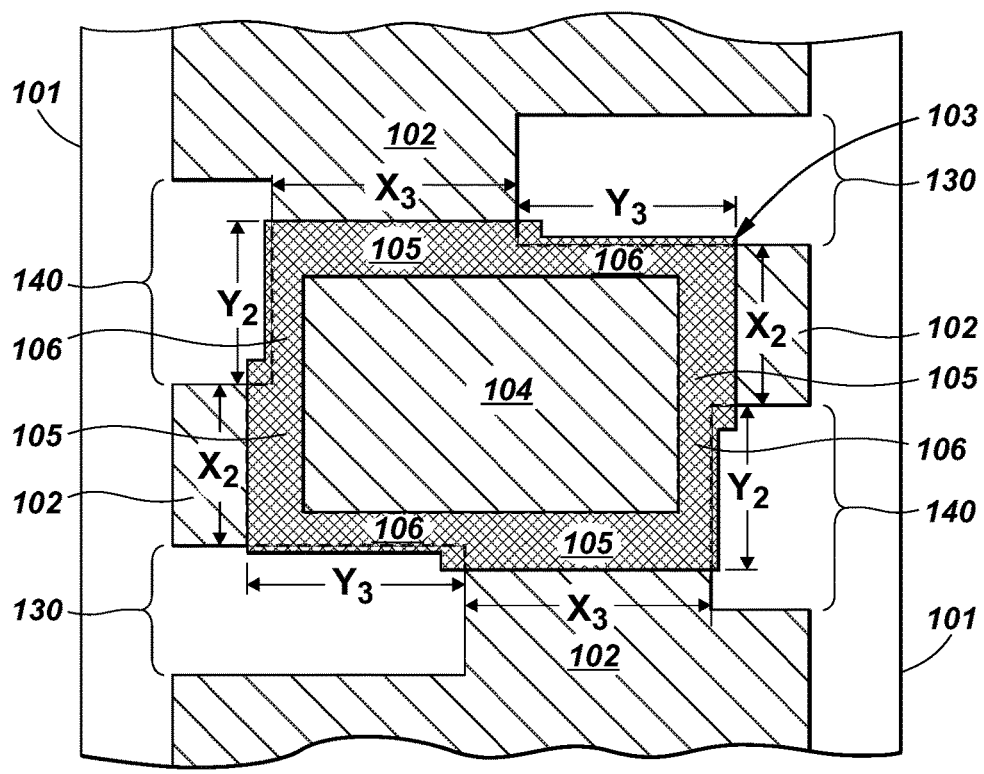
FIG. 12a is a top view of the second step of the second embodiment.
Figure 12B:
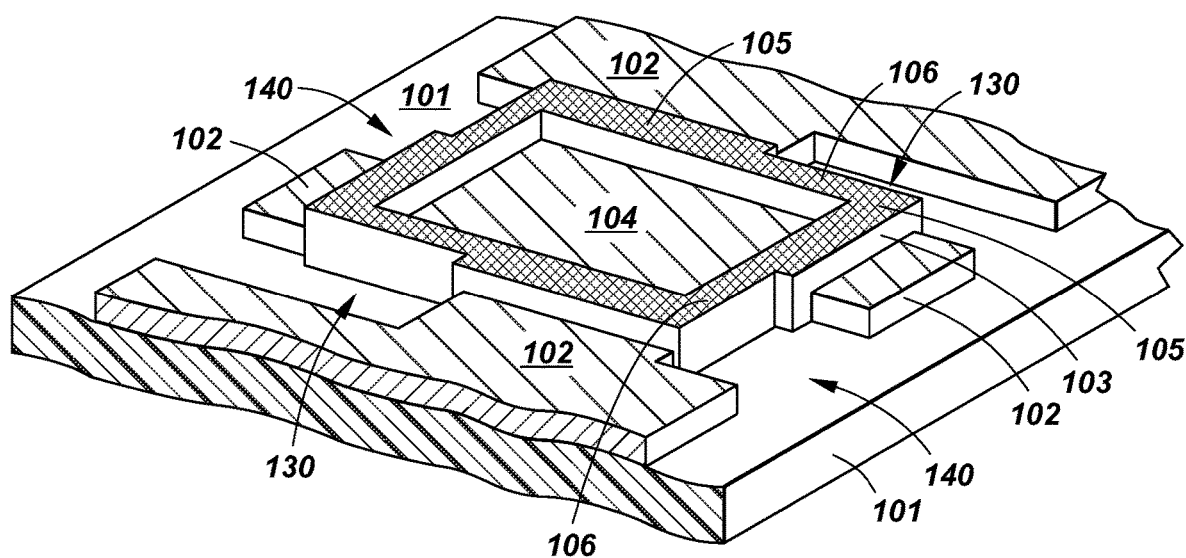

FIG. 12a shows a top view of substrate 101/first electrode 102 as shown in FIG. 11a on which an inorganic insulation layer 103 has been patterned. The pattern of inorganic insulation layer 103 is such that it lies in-between the cut-outs 130, 140 and surrounds an enclosed area 104. Thus, in this second embodiment, the portions of that inorganic insulating layer 103 that lies in both the length and width dimensions each have a first portion that is adjacent to the first electrode 102 and a second portion that is adjacent to the substrate 101. While the interior edges defining the enclosed area 104 are linear, the horizontal thickness of the inorganic insulation layer 103 lying along in either the width or length dimensions are not constant. Along the W dimension, there is a first portion 105 where the $HT_{W-iii}$ is larger and that are adjacent to the first electrode 102 in the region $X_3$ and another second portion 106 where the $HT_{W-iii}$ is less than first portion 105 and that are adjacent to the substrate 101 in the region $Y_3$. This is enabled by the presence of the larger cutoffs 130. Likewise, the inorganic insulating layer 103 that lies in the L dimension has a first portion 105 that is adjacent to the first electrode 102 in the region $X_2$ and another second portion 106 that is adjacent to the substrate 101 in the region $Y_2$. This is enabled by the presence of the smaller cutouts 140. Thus, the horizontal thickness of the inorganic insulation layer 103 in the length or width dimensions is not constant. FIG. 12b is a perspective view of FIG. 12a. As in the first embodiment, it is necessary that the inorganic insulating layer 103 in portions 106 adjacent to region $Y_2$, $Y_3$ of substrate 101 extend over the edge of the first electrode 102 so that the vertical edges of first electrode 102 are covered.

FIGS. 13a and 13b are top and perspective views where organic layer(s) 107 have been deposited uniformly over all surfaces.

Figure 14:
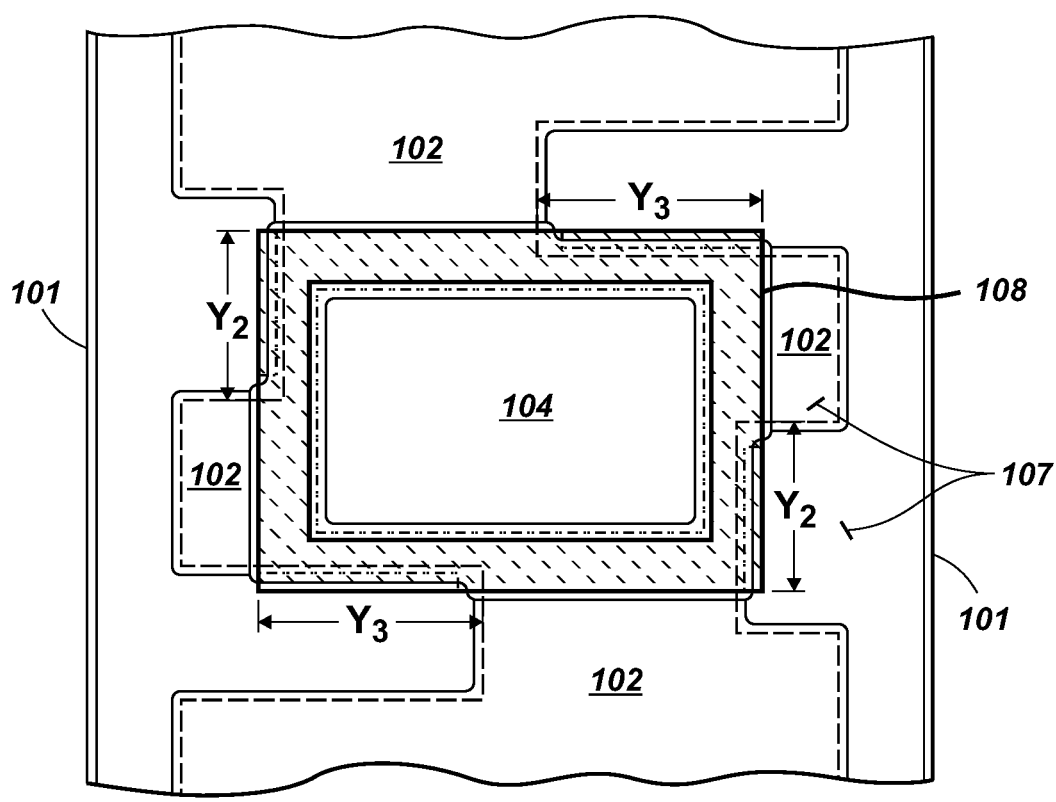
FIG. 14 is a top view after the fourth step of the second embodiment.

FIG. 14 is a top view where a sealing region 108 has been created by removal of the organic layer(s) 107 in certain regions of the inorganic insulation layer 103 as well as in regions $Y_2$ and $Y_3$ of substrate 101. In this embodiment, the horizontal thickness of the sealing region 108 is the same in both the W and L dimensions ($HT_{W-s}=HT_{L-s}$). In particular, the horizontal thickness of the sealing region is adjusted so that in the portions 105 of the inorganic insulation layer 103 where the horizontal thickness is greater, the sealing region 108 lies entirely over portions 105. However, in portions 106 of the inorganic insulation layer 103 where the horizontal thickness is less than in portions 105 and where portions 106 are adjacent to the substrate 101 in regions $Y_2$ and $Y_3$, the sealing region 108 lies partially over the portions 106 and partially over the substrate 101 in regions $Y_2$ and $Y_3$. While this example is where the horizontal thickness of the sealing region is the same without regard to the orientation or whether it is over portions 105 or 106, the horizontal thickness of the sealing region may also be adjusted so that it is greater in some regions (i.e. in areas where it partially overlies portions 106) and less in other areas (i.e. in areas where it overlies portions 105).

It should be noted (see FIGS. 12a-12b and FIG. 14) that in this particular embodiment, there are portions 105 (adjacent to the first electrode 102 in regions $X_3$) and 106 (adjacent to the substrate 101 in region $Y_3$) that both lie along the same width dimension where each portion differs in horizontal thickness (105>106). Likewise, there are portions 105 (adjacent to the first electrode 102 in regions $X_2$) and 106 (adjacent to substrate 101 in region $Y_2$) that both lie along the same length dimension where each portion differs in horizontal thickness (105>106). In this embodiment, the sealing region 8 has a constant thickness in both dimensions. However, this is not necessary. For example, the sealing region 8 could have one horizontal thickness whenever it is located over 105 but a greater horizontal thickness when located over 106 and 101 without regard to the dimension. This would create a narrower and extended area of exposed substrate 101 where the second electrode will be located in a later step.

Figure 15:
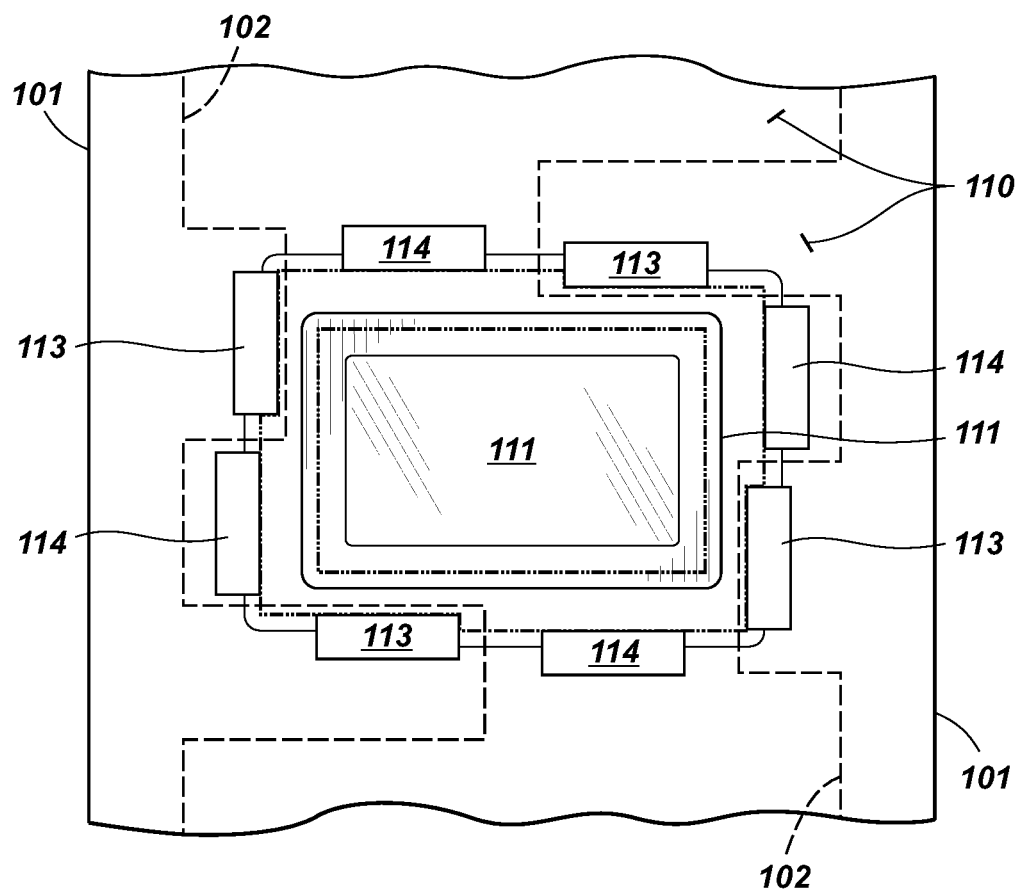
FIG. 15 is a top view of the completely encapsulated OLED device with exposed contact pads for the first and second electrodes according to the second embodiment.

FIG. 15 is a top view after the following additional steps, similar to those of the first embodiment: uniformly depositing a second electrode 109 and an optional protective layer 110 over all surfaces, patterning thin-film encapsulation 111 only over the enclosed area 104 and those parts of the sealing region 108 over the tops of the walls of the inorganic insulating layer 103 and removing overlying layers 109 and 110 from regions $X_2$ and $X_3$ (outside the encapsulation) to exposes the first electrode 102 in region 114 and removing overlying layer 110 from regions $Y_2$ and $Y_3$ (which lie outside the encapsulation 111) to expose the second electrode 109 in region 113. This represents a fully encapsulated OLED device with exposed electrical contact pads to both first and second electrodes on all sides of the device. Note that the contact pads 113, 114 for the first and second electrodes are not in contact with each. Each can be separated by a small distance to avoid incidental contact. This can be arranged by removal of the electrodes in these areas or by appropriate patterning of the first electrode in these areas during the first step.

The first embodiment illustrated by FIGS. 1-10 and the second embodiment by FIGS. 11-15 are similar in that the horizontal thicknesses of the inorganic insulation layer are different, depending on whether that section is adjacent to the substrate or first electrode, but the horizontal thickness of the sealing region can be the same or different as desired without regard to whether that section is adjacent to the substrate or first electrode. A third embodiment is shown in FIGS. 16-17. In this third embodiment, the horizontal thicknesses $HT_{W\text{-}iii}$ of portion(s) 205 and $HT_{L\text{-}iii}$ of portion(s) 206 of the inorganic insulation layer 203 are the same but the horizontal thicknesses of the sealing region ($HT_{W\text{-}s}$ and $HT_{L\text{-}s}$) are different depending whether that section is adjacent to the substrate 201 or first electrode 202.

Figure 16A:
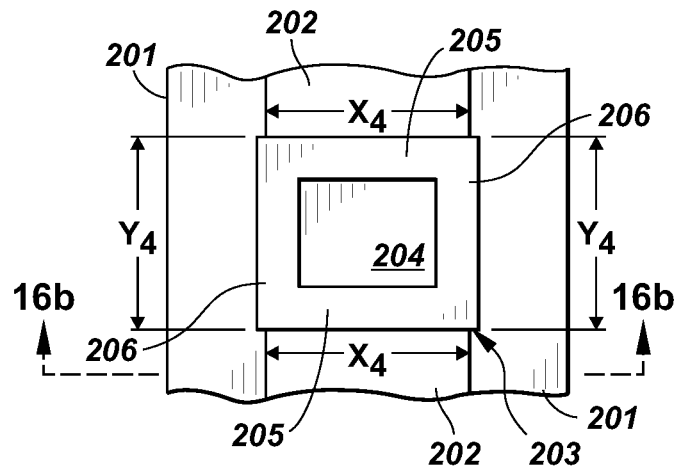
FIG. 16a is a top view of the second step of a third embodiment.
Figure 16B:
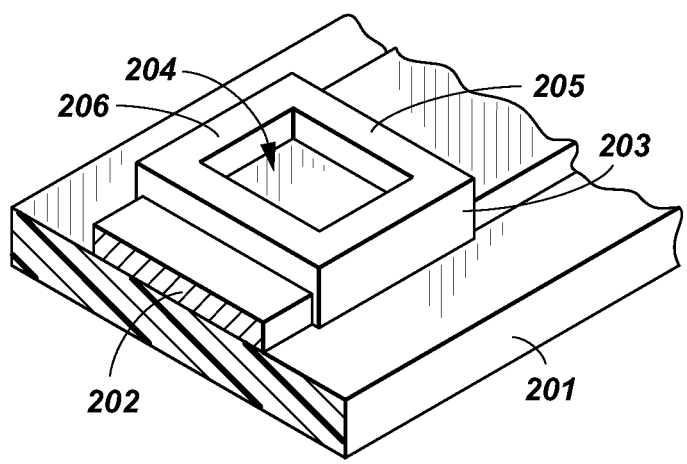
Figure 17A:
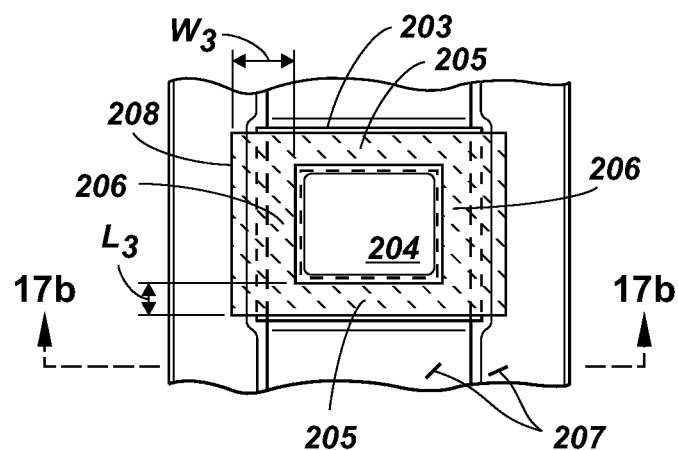
FIG. 17a is a top view after the 4$^{th}$ step of a third embodiment.
Figure 17B:
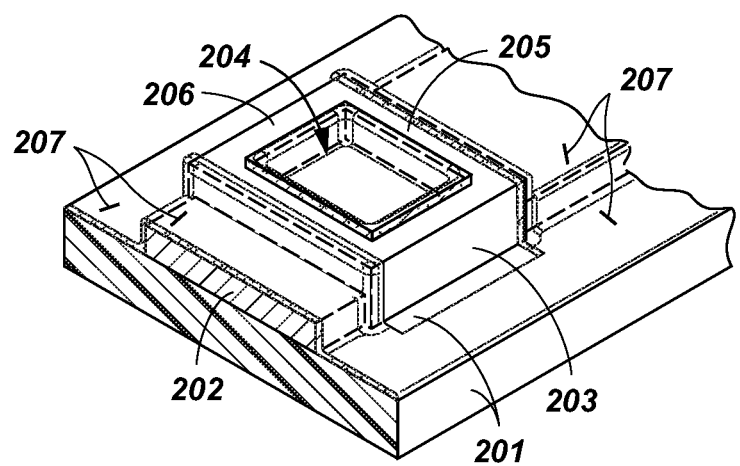

FIGS. 16a and 16b show top and perspective views where, starting with the same first electrode 202/substrate 201 pattern as shown in FIGS. 1a and 1b, an inorganic insulation layer 203 has been patterned. The pattern forms an enclosed area 204. The inorganic insulation layer 203 thus forms first 205 and second 206 portions around the enclosed area 204. The first portions 205 of the inorganic insulation layer 203 are those that lie along the width dimension and the second portions 206 are those that lie along the length dimension. Within the enclosed area 204 is the top surface of the first electrode 202. Thus, the enclosed area 204 forms a "well" which is surrounded on all sides by walls of the inorganic insulating layer 203 and where the bottom is the first electrode 202. In this embodiment, the horizontal thickness of the walls formed by the inorganic insulation layer 203 are the same throughout ($HT_{W\text{-}iii}=HT_{L\text{-}iii}$). Note that first portions 205 are adjacent to the first electrode layer 202 on the opposite side from the enclosed area layer 204 which is indicated in FIGS. 17a and 17b by $X_4$. Note that second portions 206 are adjacent to the substrate 201 on the side on the opposite side from the enclosed area layer 204 which is indicated in FIGS. 2a and 2b by $Y_4$. As in other embodiments, the insulating inorganic layer 203 covers the vertical edges of the first electrode 202 in regions $Y_4$.

After depositing at least one organic layer 207 uniformly over the entire surface (analogous to that shown in FIGS. 3a and 3b), FIGS. 17a and 17b show top and perspective views where a sealing region 208 is created by removal of the organic layer(s) 207 in certain regions.

In this embodiment, those portions of the sealing region 208 in the width dimension lies entirely on top of the first portions 205 of the inorganic insulation layer 203 and that $HT_{W\text{-}s}$ is less than $HT_{W\text{-}iii}$. In these portions, the organic layer(s) 207 are removed to expose the top of the underlying first portions 205 of the inorganic insulation layer 203. Note that first portions 205 are located adjacent to the first electrode 202 in region $X_4$. The sealing region 208 should be located so that on the side closest to the enclosed area, a small amount of organic material 207 remains along the top edge of the portions 205 of the inorganic insulation layer 203. This is to avoid any possibility of misalignment where the sealing region 208 would impinge into the enclosed area 204. FIG. 16a also shows that portions of the sealing region 208 lie partially over the second portions 206 and partially over substrate 201 along the length direction and $HT_{L\text{-}s}$ is greater than $HT_{W\text{-}s}$. Note that second portions 206 are located adjacent to the substrate 201 in regions $Y_4$. These portions of the sealing region 208 only partially overlaps the second portions 206 of the inorganic insulation layer 203 and has a horizontal thickness ($HT_{L\text{-}s}$) sufficient to extend in the width direction to remove the organic layer(s) 207 that are present both on the top of portions 206 of the inorganic insulating layer 203 as well as on top of the substrate 201 for some distance away from the portions 206 of the inorganic insulation layer 203. The sealing region 208 should be located so that on the side closest to the enclosed area 204, a small amount of organic material 207 remains along the top edge of the portions 206 of the inorganic insulation layer 203.

It should be noted (see FIGS. 16a-16b and FIG. 17a) that in this particular embodiment, the horizontal thickness of portions 205 and 206 are the same without regard to the dimension. In this embodiment, the horizontal thickness of the sealing region 8 depends on whether it is adjacent to the substrate 201 (region $Y_4$) or first electrode 202 (region $X_4$). As illustrated, the horizontal thickness of the sealing region 8 is greater in the length dimension (over 206 and 201) than the width dimension (over 205) and is constant along either dimension. However, this is not necessary. For example, one portion of the sealing region 8 in the length dimension could have the same horizontal thickness as the width dimension but the remaining portion of 8 in the length dimension could be greater in horizontal thickness. This would create a narrower but extended area of exposed substrate 201 where the second electrode will be located in a later step.

In any case, in this embodiment, by adjustment and proper choice of horizontal thickness of the sealing region 208 and positioning, the organic layer(s) 207 are removed at least partially from along the top of the inorganic insulation layer 203 in both the width and length directions around the enclosed area 204 and also from the top layer of the substrate 201 to the side (in the width direction) of the enclosed area 204. This is enabled by having the horizontal thickness of the sealing region 208 dependent on whether that section of the inorganic insulation layer is adjacent to the first electrode 202 or the substrate 201. In this way, the sealing region 208 will be free from organic layer(s) that would render the eventual encapsulation of the enclosed region 204 ineffective. Moreover, because the sealing region 208 in part extends to the side of the enclosed area over the substrate 201, an area is created where the second electrode 209 can lie directly over the substrate 201 instead of over organic layer(s).

Some additional details and features of OLED panels that can manufactured using a patterned inorganic insulation layer and material removal in a sealing region in order to minimize the number of steps requiring shadow masking during vapor deposition will now be described.

While this method would be preferred for OLED lighting panels; that is, OLED panels used for general illumination purposes that feature a uniform area of light emission, OLED displays (i.e. pixelated devices) are also suitable. OLED lighting panels are available in different shapes, sizes and thicknesses on their own substrate. For example, such lighting panels can be rectangular (including rectangles with rounded edges), square, round, oval or triangular. The size used is generally large enough to provide a sufficient amount of light for the design needs. If the design requires additional light than can be provided by a single panel, multiple lighting panels, wired in either series or parallel and with one single controller or with individual controllers, can be used. The panels can emit white light of any color temperature or in some examples such as automotive taillights, can emit colored light.

The substrate can be glass (including flexible glass), metal or polymeric materials. Generally speaking, it will be flat with a uniform thickness. It may be transparent, semi-transparent or opaque. Since the substrate will be part of the overall encapsulation for the OLED, it should be sufficiently impervious to air and water so that the OLED will have desired lifetime. The substrate can be rigid or flexible. It can be used as a long roll or individual panels. Flexible substrates are preferred for roll-to-roll applications, although this is not necessary. In some cases, the substrate may be mounted temporarily or permanently onto a separate holder or housing during manufacture. The substrate may have various types of subbing layers (i.e. planarization layers, light management layers, etc.) which may be patterned or unpatterned and can be either on the top or bottom surfaces. The substrate is considered as including all layers or structures on which the first electrode is directly deposited.

There is a patterned first electrode that is deposited on the top surface of the substrate. It does not completely cover the top surface. The first electrode can be transparent, semi-transparent or opaque. If the first electrode is transparent or semi-transparent, then the device will be a bottom emitter. If the first electrode is opaque, then the device will be a top emitter. It may be the anode or the cathode. If the first electrode is an anode, it is preferable to be transparent. The transparent first electrode should transmit as much light as possible, preferably having a transmittance of at least 70% or more desirably at least 80%. However, in some applications (i.e. microcavity devices), the transparent first electrode may only be semi-transparent and have partial reflectivity. The transparent first electrode may be a continuous film or a conductive network of silver nanowires or carbon nanotubes. While the first transparent electrode may be made of any conductive materials, metal oxides such as ITO or AZO or thin layers of metals such as Ag are preferable. In some cases, there may be an auxiliary electrode to help distribute charge more uniformly across the full plane of the transparent electrode. If the first electrode is a cathode, it is preferable to be opaque and desirably composed of a thicker layer of metal or metal alloy such as Al, Ag, Mg/Al, Mg/Ag, Li/Ag and the like. The first electrode may be deposited by any known technique.

The inorganic insulation layer is patterned over the first electrode. It should not be electrically conductive and should have a high electrical resistivity. It should be impervious to air and water penetration. It may be a metal salt such as a metal oxide or nitride or a mixture of metal salts. Some examples include aluminum (for example, $Al_2O_3$), silicon oxides (for example, $SiO_2$), silicon nitrides (for example, $Si_3N_4$), or silicon oxynitride (for example, $SiO_xN_y$). Of these, $SiO_2$ is preferred. It may also be made of glass or glass frit or any coatable dielectric material. These materials may be deposited using any appropriate method including as reactive sputtering, CVD and PECVD. In some cases, the presence of physical defects such as pinholes or cracks may allow for some electrical conduction between electrodes, which is undesirable. For this reason, the type of material and deposition method should be chosen to provide sufficient electrical resistance between the electrodes and minimize the presence of any physical defects. Any appropriate method may be used to pattern the inorganic insulation layer. This includes shadow masking, screen printing, photolithographic techniques, ink-jet printing, gravure printing, and the like.

The inorganic insulation layer is deposited in a pattern that surrounds an enclosed area of the first electrode. The first electrode is continuous within the enclosed area and extends in all directions without breaks. The enclosed area may be any shape; for example, square, rectangular (with or without rounded edges), circular, triangular and the like. No matter the shape, the length dimension lies along the longest axis and the width dimensions lies along the shortest axis. The enclosed area will contain the emissive organic layers of the OLED and when completed will form the active emissive area of the OLED. For this reason, it is highly desirable that the enclosed area be as large as possible over the surface of the substrate. It is important that the first electrode extends out from under of at least part of the inorganic insulation layer on the side opposite of the enclosed area. This area of the first electrode will then be adjacent to the outside edge (away from the enclosed area) of the inorganic insulating layer. This extension of the first electrode on the opposite side of the inorganic insulation layer should be in electrical contact with the first electrode within the enclosed area; desirably, the first electrode is continuous under the inorganic insulation layer. This is so external electrical connections can be made to the first electrode outside of the encapsulation. The portion of the first electrode lying outside the inorganic insulation layer can run along the entire edge in either direction or may be along only part of the edge.

In some embodiments, the inorganic insulation layer may extend over the edge of the first electrode and covers the vertical edge of the first electrode to prevent short-circuits with the second electrode. This creates a situation where the contact pad for the second electrode (which as shown in the first and second embodiments, is located on the substrate) may not be at the same relative height as the first electrode contact pad. This may be avoided by adding an isolated layer on the substrate but at a distance from the second electrode and which has the same vertical thickness as the first electrode. At least a portion of this isolated pad would need to be outside the encapsulation layer. In this embodiment, the pad can be non-conductive or conductive (but not in electrical contact with the first electrode). In particular, there can be an isolated (not electrically in contact) pad of the same conductive material as the first electrode separated by a gap from the first electrode and deposited at the same time as the first electrode. In this embodiment, the inorganic insulation layer can extend over the edge of the first electrode, the gap (the bottom of which is the substrate) and at least partially over the isolated pad. Eventually, the second electrode will be deposited over this area and make contact with the isolated pad. After removal of any overlying layers, the external contact pad, comprising the second electrode over the isolated pad, will be at the same relative height above the substrate as the contact pad for the first electrode.

Figure 18A:
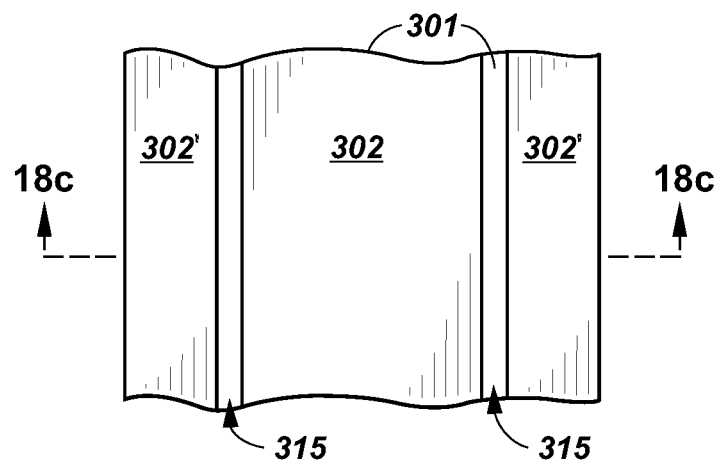
FIG. 18a is a top view of the first step of a 4$^{th}$ embodiment.
Figure 18B:
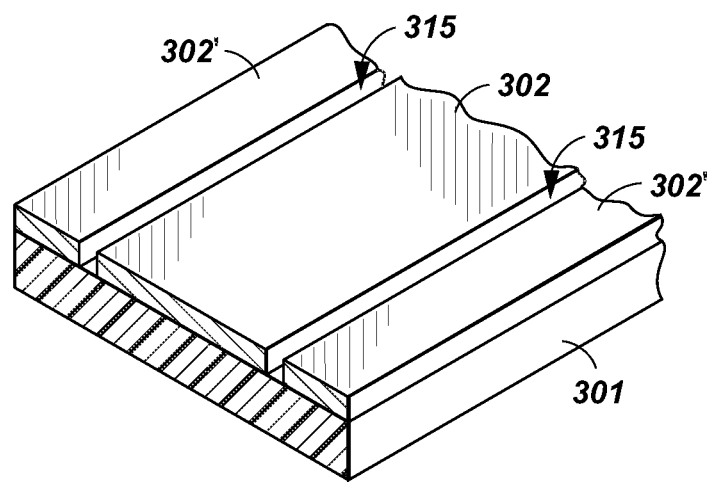
Figure 18C:
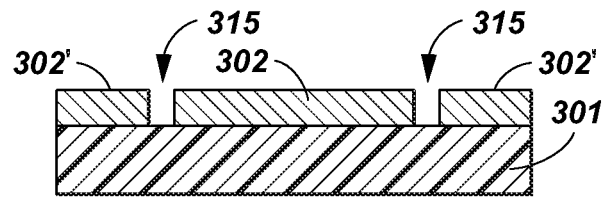
FIG. 18c is a cross-sectional view along the length direction.

For example, in a fourth embodiment, FIG. 18a shows a top view similar to FIG. 1a but where isolated pads 302' of the same material as the first electrode 302 has been deposited along the edges of the substrate 301 in the length direction. This creates gaps 315 between first electrode 302 and isolated pads 302'. Note that there is no electrical connection between the isolated pads 302' and first electrode 302. FIG. 18b shows a perspective view of FIG. 18a. FIG. 18c shows the corresponding cross-sectional view in the length direction of FIG. 18a.

FIG. 19a shows a top view where an inorganic insulating layer 303 has been deposited so it extends over the edge of the first electrode 302 and gap 315 to the isolated pad 302'. In this figure, the horizontal thicknesses of these portions 306 of the inorganic insulation layer in the length direction are less than the horizontal thickness of the width portions 305 as in the first embodiment. However, it is also possible where the horizontal thicknesses of 305 and 306 could be the same as according to the second embodiment. FIG. 19b is a perspective view. FIG. 19c is a cross-sectional view in the length direction.

Figure 20A:
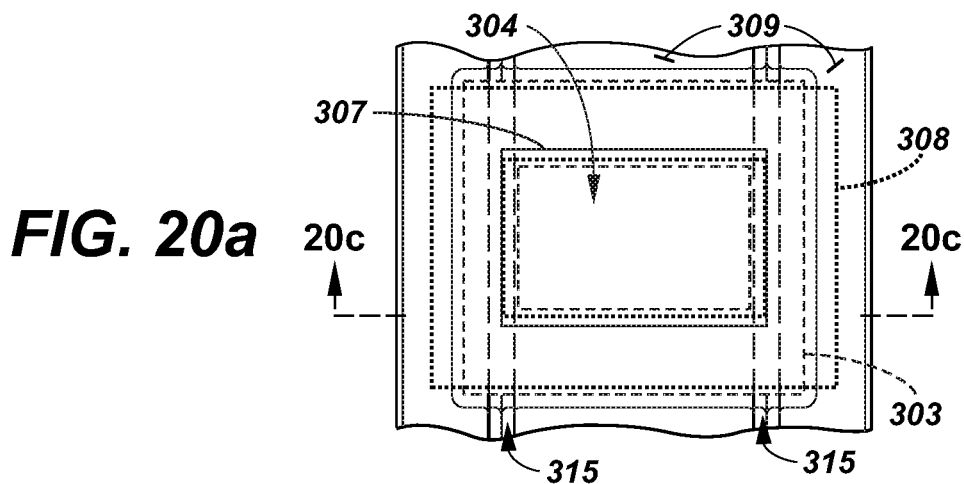
FIG. 20a is a top view of the third step of the 4$^{th}$ embodiment.
Figure 20B:
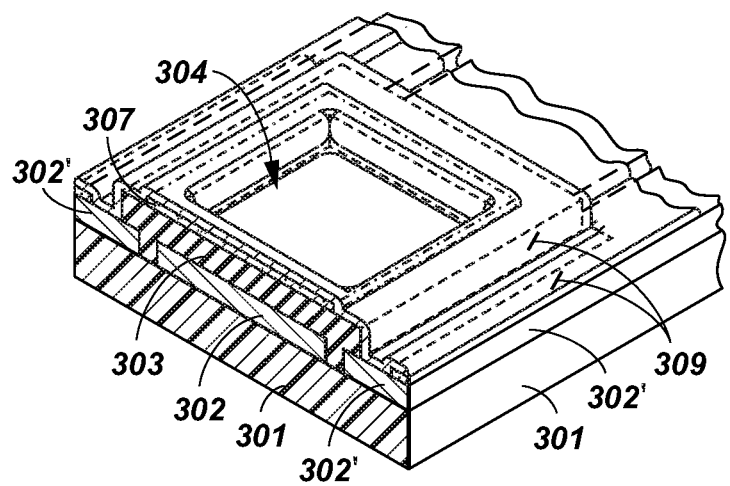
Figure 20C:
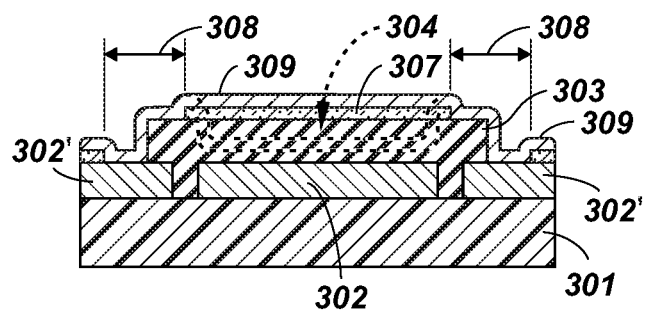
FIG. 20c is a cross-sectional view along the length direction.

FIG. 20a shows a top view where organic layer(s) 307 have been uniformly deposited over the entire surface and indicates the location of the sealing region 308 where the organic layer(s) 307 will be removed. FIG. 20b is a perspective view. FIG. 20c is a cross-sectional view in the length direction.

Figure 21:
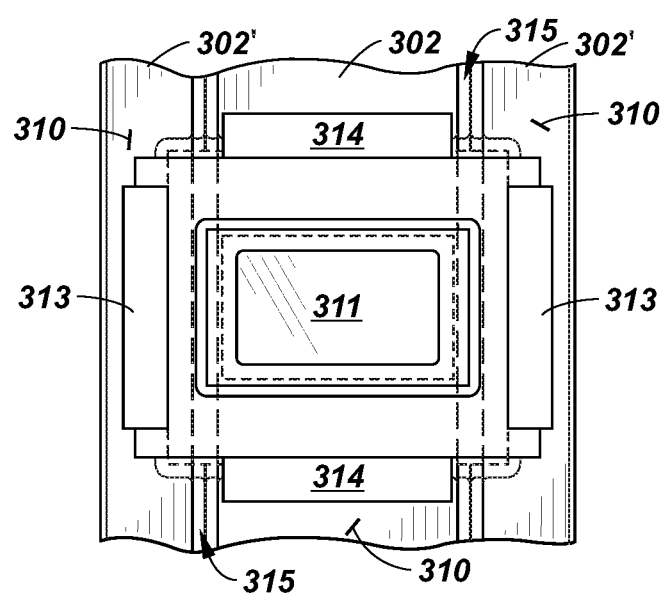
FIG. 21 is a top view of the completed device of the 4$^{th}$ embodiment.

As per the first embodiment (after formation of the sealing region 308 as indicated in FIG. 20a), FIG. 21 shows where second electrode 309 is deposited uniformly over all surfaces and followed by the uniform deposition of optional protective layer 310. Next, thin-film encapsulation 311 is patterned over the top of those portions of the sealing region 308 over the inorganic insulating layer 303, leaving areas outside of the sealing region 308 covered by protective layer 310. Next, the contact pads 314 for the first electrode 302 and the contact pads 313 for the second electrode 309 are uncovered outside the encapsulation 311 by removal of any overlying layers. This completes the device as shown in FIG. 21. In this embodiment, the contact pads 313 for second electrode 309 lie over the isolated pads 302' on either side of the encapsulation while the contact pads 314 lie over the second electrode. Both sets of external contact pads 313, 314 are at the same relative height above the substrate.

It is important that the inorganic insulation layer provide sufficient electrical resistance between the two electrodes since it will be the only material separating them in some areas. Ideally, the thickness of the inorganic insulating layer should be chosen to provide sufficient electrical resistance between the electrodes. The inorganic insulation layer should be deposited so its vertical thickness (above the deposition surface) is at least 0.01 µm high, preferable at least 0.05 µm and desirably in the range of 0.1-10 µm, particularly in the range of 0.2-5.0 µm. The vertical thickness should be uniform throughout.

The enclosed area surrounded by the inorganic insulation layer will be initially filled with the organic layer(s) for OLED light emission. Because the organic layer(s) are deposited uniformly over the entire surface, they also will be deposited on the top of the walls. Most of the organic layers will be removed from the top of these walls during the formation of the sealing region. Then the second electrode is then deposited uniformly over the entire surface. However, the second electrode will remain over the top of the walls and under the encapsulation within the sealing region. However, there can be problems with weak spots or discontinuities in the second electrode if the height differential is too great or too sharp an angle between top surface of the organic layer(s) and the top surface of the surrounding inorganic insulation layer. In order to prevent this, either the vertical thickness should be chosen according to the total vertical thickness of the organic layer(s) or the inorganic insolation layer could be designed to accommodate the transition of the second electrode from the enclosed area to the inorganic insulation layer. For example, the top of the insulation layer may be slanted or rounded as to prevent a sharp transition of the second electrode.

The organic layer(s) for light emission may be any of the formulations and compositions known in the art for OLED emission and used as desired. There should be at least one light-emitting layer. The color of the light is not critical and may be varied as desired although white is most desirable for general lighting purposes. The method for deposition of the organic layer(s) is not critical and any known method may be used. Typical methods for forming the organic layers (no patterning or masks required) are thermal evaporation techniques such as vapor deposition or solution techniques such as solution coating, spraying or ink-jet methods. Since ink-jet methods do not require shadow masks, it may be possible to only deposit the organic layer(s) within the enclosed area where the inner sides of the inorganic insulating layer may form walls or banks that contain the ink-jetted solutions. The banks may be treated to help control the deposition of the solution within the enclosed area.

The formation of the sealing region requires removal of the organic layer(s) in specific and defined locations; the locations being of the top of the walls of the inorganic insulation layer surrounding the enclosed area along with at least one area of the substrate (or isolated pad) adjacent to the outside walls of the inorganic insulating area. The sealing region on the top of walls is continuous and unbroken in both the length and width directions; that is, those portions of the sealing region in the length direction are connected to those portions in the length direction. In those areas where the sealing region extends past the walls to the substrate, this area is also a continuous and unbroken part of the sealing region on top of the walls. The creation of the sealing region may include any known method to remove organic materials in specific locations. For example, such methods include thermal treatment, radiation treatment, solution treatment, chemical treatment or mechanical treatments. Thermal methods may include laser ablation or thermal evaporation or sublimation under high vacuum. Radiation treatment may include decomposition of the organic materials by high energy radiation such as X-rays. Solution treatments may include wet etching or alternatively, applying a solvent in the desired locations (for example, by ink-jet delivery) and then removal of the dissolved materials. Chemical treatments may include dry etching. Mechanical treatment may involve localized scrubbing, scraping, sanding or ultrasonic treatment to physical dislodge the material. Of these, thermal treatment using a laser to either ablate the organic materials or cause localized heating to evaporate or sublime the organic material is preferred. The wavelength and power (for example 3-20 W) of the laser radiation may be selected according to the material being removed. For example, a $CO_2$ laser with 9.3 µm wavelength can be used to remove some materials such as organics, but not others such as metals due to reflection. However, a UV laser with a 355 nm wavelength is suitable for removal of organic materials and some metals. As noted previously, the sealing region should not impinge into the enclosed area so it is desirable not to have the inside edge of the sealing region too close to the edge of the enclosed area. This will leave residual some organic layer(s) along the edge. Within the sealing region (either over the inorganic insulation layer or first electrode), it is desirable to remove as much organic material as possible; however, some can remain so long as it does not interfere or degrade the encapsulation.

The top of the inorganic insulation layer may be pretreated after its deposition to promote removal of the organics along with the part of the first electrode within the sealing region. There may be an additional layer or layers of material deposited over the inorganic insulation layer or first electrode after its deposition in order to help adjust or promote its properties. For example, the materials may prevent strong bonding to inorganic insulation layer or first electrode. Such removal promoting layers may be applied only on the inorganic insulation layer or first electrode within the sealing region or uniformly over the entire surface.

Over the organic layers, there is a second electrode. The second electrode may be transparent or opaque. If transparent, it is desirably composed of conductive transparent metal oxides such as ITO or thin layers of metals such as Ag. If opaque, it is desirably composed of a thicker layer of metal or metal alloy such as Al, Ag, Mg/Al, Mg/Ag, Li/Ag and the like. The second electrode may be deposited by any known technique. As with the organic layers, the second electrode may be deposited over the entire substrate.

Over the second electrode, there may optionally be a protective layer. This is to prevent possible damage to the second electrode and underlying organic layers from applying the encapsulation. It is desirable that this layer is not patterned and deposited uniformly over the entire substrate. However, in some cases, the protective layer may be patterned to lie only over the enclosed area or only over the enclosed area and at least part of the sealing region. If only over the enclosed area and not over the sealing region, the protective layer may be inorganic or organic materials such as a polymer. However, if the protective layer is present in the sealing region, it should be inorganic since organic materials are not impervious to air or water penetration. It should be electrically non-conductive. Suitable materials include aluminum or silicon oxides or nitrides.

Over the second electrode and optional protective layer, if present, is deposited or placed encapsulation. At a minimum, the encapsulation should fully cover the enclosed area and at least part of the sealing region along the tops of the walls of inorganic insulating layer that surround the enclosed area. It may extend along entire top of the walls of the inorganic insulating layer. It may extend out past the sealing region if desired. However, if it extends over any of the electrode contact areas connected to either the first or second electrodes, it will be necessary to remove any encapsulation overlying these areas so that external electrical contact can be made to the contact pads. The encapsulation should be impervious to air and water penetration. It may be transparent or opaque. It should not be electrically conductive. It may be formed in-situ or added as a separate pre-formed sheet.

An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired.

Alternatively, encapsulation may be provided using a pre-formed sheet or cover slip which is attached over at least sealing region and enclosed area. For example, encapsulation could be provided by a laminated film comprising a metal foil and a getter-containing adhesive. The pre-formed sheet may be rigid or flexible. It could be made of glass (including flexible glass), metal or laminated organic/inorganic barrier layers. It should have a thermal expansion coefficient that is close to the inorganic insulation layer to achieve a more robust connection. Pre-formed encapsulation sheets may need to be attached over the sealing region using air and water proof adhesives such as silicon adhesives or adhesives containing desiccating particles such as calcium oxide, or by thermal means such as ultrasonic welding or glass frit welding, which may require additional sealants such as solder or glass frit. It should be at least 0.5 μm thick, preferably at least 1 μm thick and most desirably in the range of 10-100 μm thick. The side and bottom edges of the cover slip can be specially designed to have better fit to the sealing region or promote a better seal. The cover slip and sealing region may be designed together so that they fit or lock partially in place before the seal is formed. Moreover, the cover slip may be pretreated to promote better adhesion to the sealing region. There may be getter particles or desiccants present as part of the encapsulation.

Once the sealing region and enclosed area are fully encapsulated, it may be necessary to remove any overlying layers from the contacts pads for the first electrode. The contact pad for the first electrode is that part of the first electrode that extends out under the inorganic insulation layer from the enclosed area. After the encapsulation step, it will be covered with at least the organic layer(s), second electrode and if present, the protective layer and encapsulation if these were deposited uniformly. These overlying layers can be removed from over the first electrode contact pad by any appropriate means such as thermal treatments such as laser ablation or laser sublimation, solvents or mechanical means such as nitrogen jet, sticky tape, scratching or scrubbing. It is also possible that a release layer be coated over the first electrode prior to deposition of the inorganic insulation layer in this region. After the encapsulation is complete, the release layer will enable the removal of any overlying layers in this region by appropriate treatment.

Moreover, it may be necessary to remove any overlying layers from the contacts pads for the second electrode. The contact pad for the second electrode is that part of the second electrode that extends out from the sealing region over either the substrate or isolated pad. The second electrode contact pad may also be a conductive layer in electrical contact with the second electrode. After the encapsulation step, it will be covered with at least, if present, the protective layer and encapsulation if these were deposited uniformly. Any overlying layers can be removed from over the second electrode contact pad by any appropriate means such as thermal treatments such as laser ablation or laser sublimation, solvents or mechanical means such as nitrogen jet, sticky tape, scratching or scrubbing. It is also possible that a release layer be coated over the first electrode prior to deposition of the inorganic insulation layer in this region. After the encapsulation is complete, the release layer will enable the removal of any overlying layers in this region by appropriate treatment.

The embodiments and corresponding methods of manufacturing previously described are particularly well suited to making color tunable OLED lighting panels. Generally speaking, color tunable OLED lighting panels have a first electrode, a first light-generating unit of one color temperature, an intermediate electrode that is independently controllable of the other electrodes, a second light-generating unit of a color temperature different from the first unit and a second electrode. The intermediate electrode is transparent and is typically made of a thin (3-20 nm) layer of metal such as Ag. By controlling the relative power supplied to each of the three electrodes, the total emission of the lighting panel can be varied from entirely the first unit, entirely the second unit or any mixture of the two.

For example, a fifth embodiment is a method for making a color tunable OLED lighting panel with three independently controllable electrodes is described in FIGS. 22-28. This particular embodiment uses a similar method as shown in FIGS. 1-10 according to the first embodiment as well as the use of the method described in FIGS. 18-21 according to the fourth embodiment. It should be appreciated that features from the second or third embodiments could be applied as well.

Figure 22:
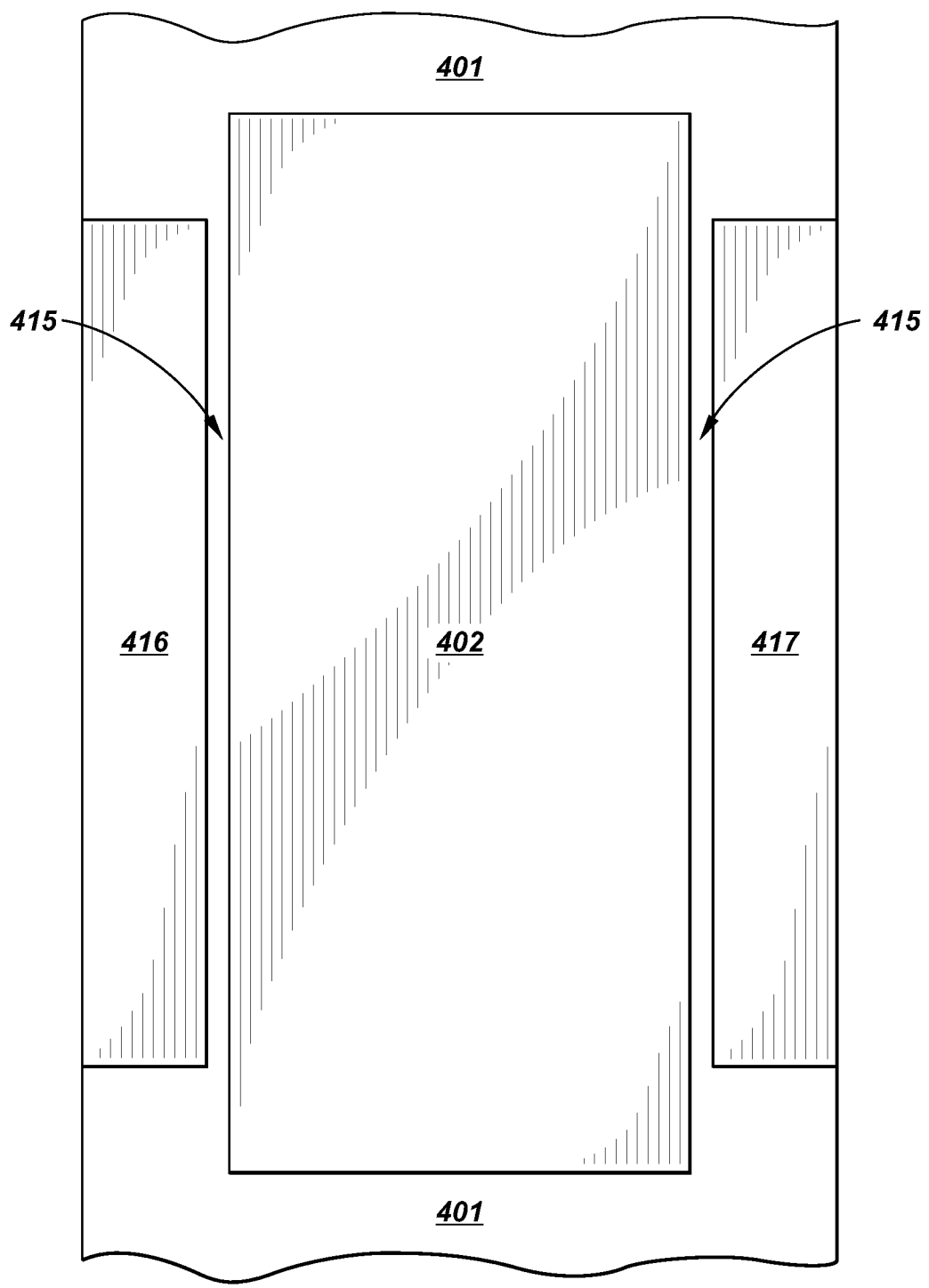
FIG. 22 is a top view of first step of the method of a 5$^{th}$ embodiment to make a color tunable OLED panel with three independent electrode layers.

FIG. 22 is a top view of first step of the method of this fifth embodiment. The substrate 401 has a pad of first electrode 402 which is separated (in the length direction) by a gap 415 from an isolated contact pad 416 and on the opposite side, separated from another isolated contact pad 417 by a second gap 415. The isolated pads 416 and 417 can be made from the same material as the first electrode 402 but are not in electrical contact with the first electrode or each other. Note that in this example, the length of contact pads 416 and 417 are less than the length of the first electrode. While not necessary, this is desirable so that there is less chance of accidental short-circuiting between different electrodes at the corners in the completed device.

Figure 23:
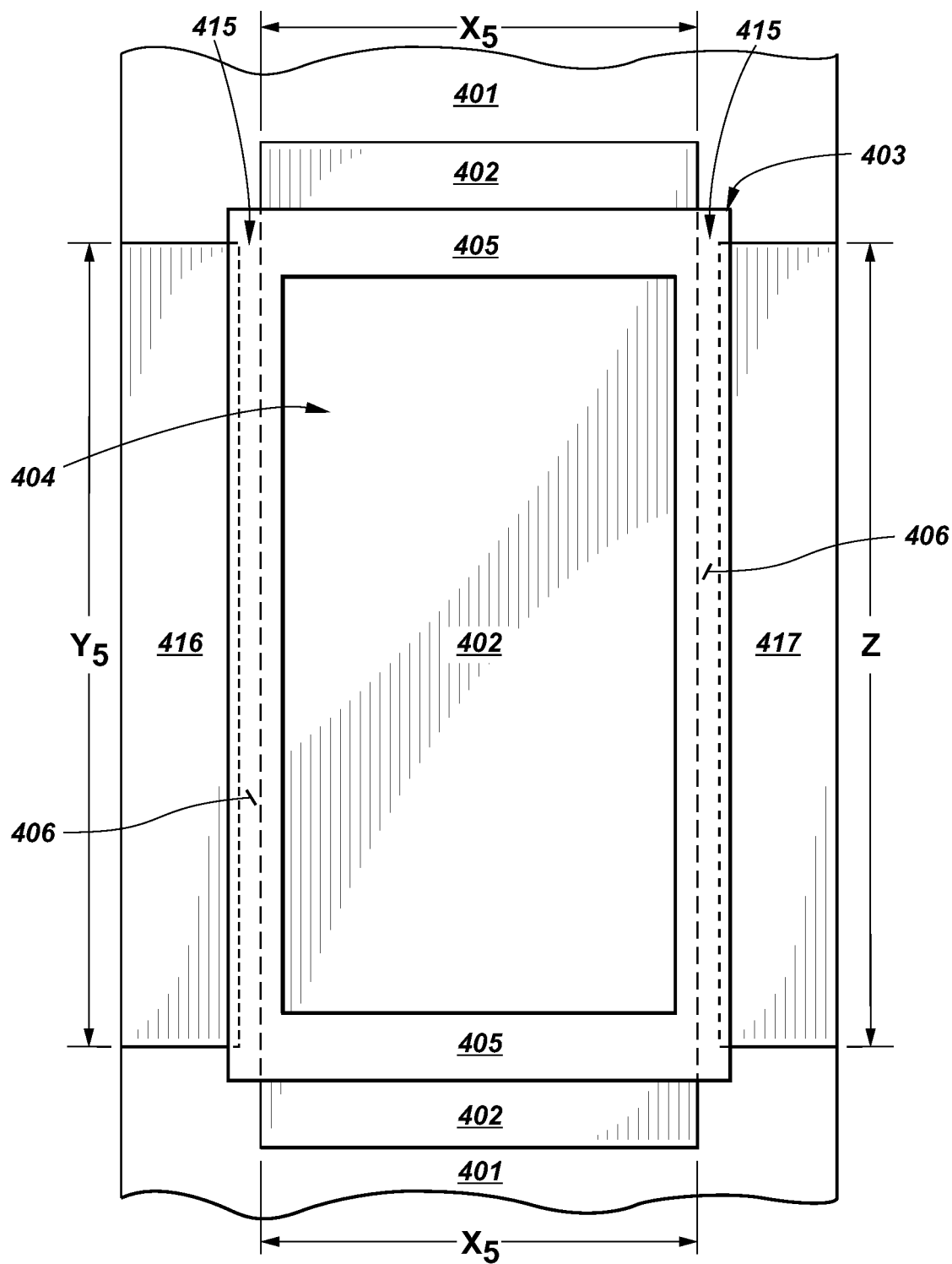
FIG. 23 is a top view of the second step of this method.

FIG. 23 is a top view of the second step of this method. A patterned inorganic insulating layer 403 has been deposited over the second electrode 402 to create an enclosed area 404. The inorganic insulating layer 403 is patterned in the width direction such that overlaps the edges of the first electrode 402 over the gap 415 and partially over the isolated pads 416 and 417. The exposed part of the isolated pad 416 running along the adjacent wall 406 of the inorganic insulating layer 403 is indicated by $Y_5$. The exposed part of the isolated pad 417 running along the adjacent wall 406 of the inorganic insulating layer 403 is indicated by Z. The exposed parts of the first electrode 402 adjacent to walls 405 are indicated by $X_5$. The horizontal thicknesses of the walls 405 (in the width direction) are greater than the horizontal thicknesses of the walls 406 (in the length direction).

Figure 24A:
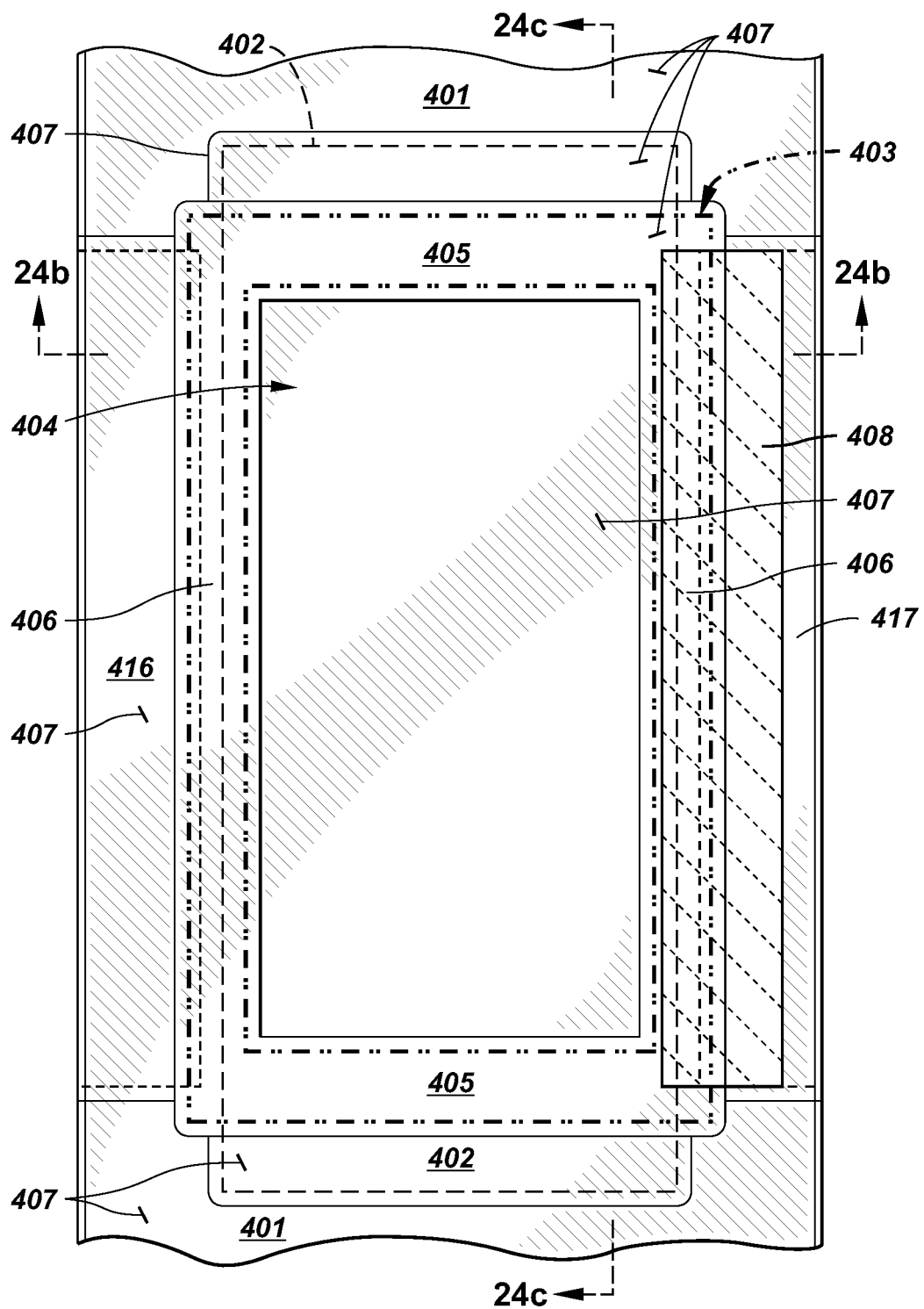
FIG. 24a is a top view of the third step of the method.
Figure 24B:
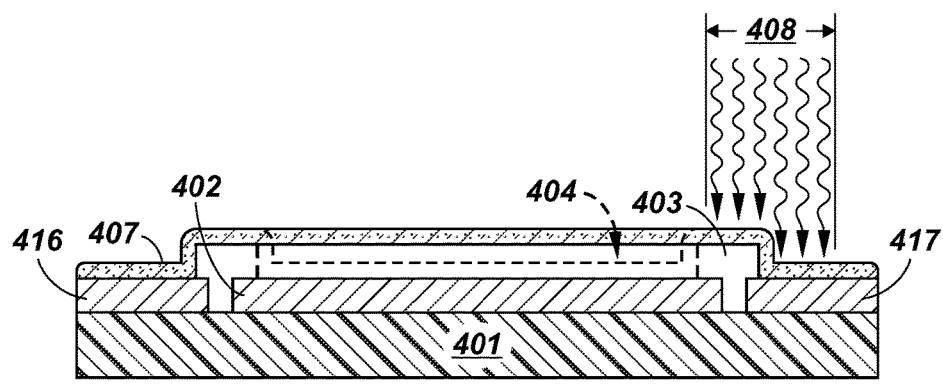
FIG. 24b is a cross-sectional view along the width direction.
Figure 24C:
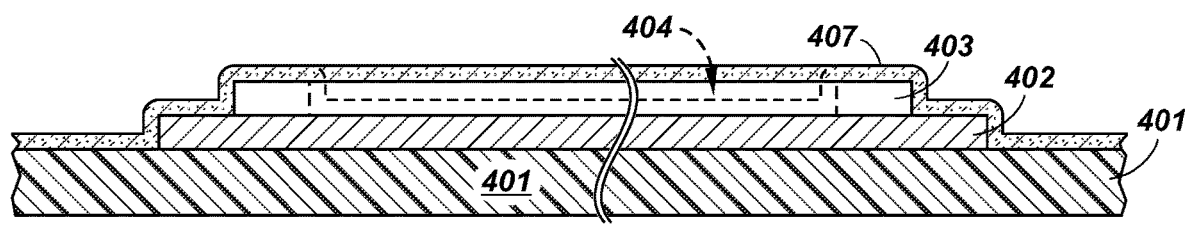
FIG. 24c is a cross-sectional view along the length direction.

FIG. 24a is a top view of the next step of the method where all of the structures shown in FIG. 23 have been covered uniformly with first organic layer(s) 407 of the first light-generating unit. This figure also indicates the position of a first sealing region 408 where all of the organic layer(s) 407 will be removed. The sealing region 408 is located partially over both the wall 406 and extends at least partially into area Z of isolated pad 417. This area will eventually serve as the contact pad 450 for an intermediate electrode 420. FIG. 24b is a cross-sectional view along the length direction. FIG. 24c is a cross-sectional view along the width direction.

Figure 25:
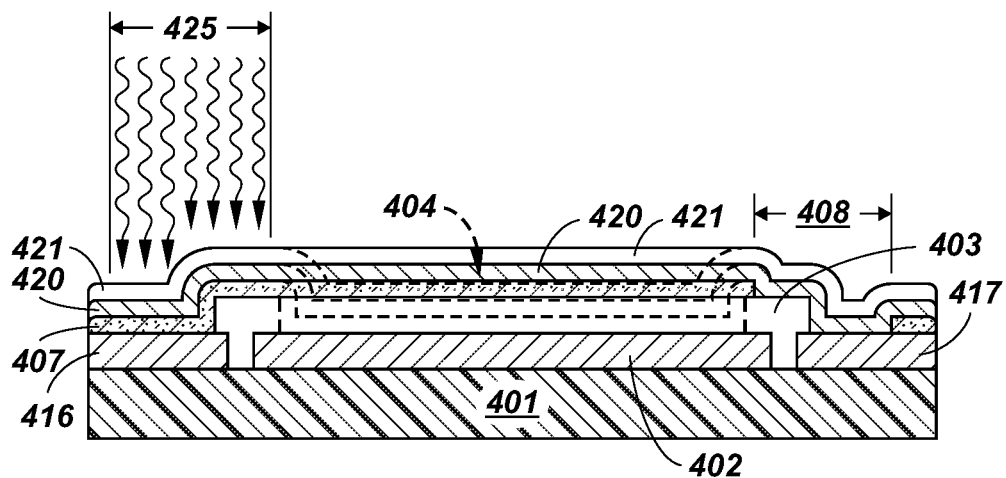
FIG. 25 is a cross-sectional view after formation of a first sealing region over portion and deposition of an intermediate electrode and additional organic layer(s) and indicates the position of the second sealing region.

FIG. 25 is the cross-sectional view where, starting as in FIG. 24b, sealing region 408 was formed with removal of the first organic layer(s) 407 over isolated pad 417 and intermediate electrode 420 was deposited uniformly. Note that the intermediate electrode 420 is in direct contact with isolated pad 417 in region Z. This is followed by the uniform deposition of second organic layers 421 of the second light-generating unit. This figure also indicates where a second sealing region 425 will be located where the first organic layer(s) 407, intermediate electrode 420 and second organic layer(s) 421 will be removed over the top of the inorganic insulation layer 403 and isolated pad 416. The sealing region 425 is located partially over both the wall 406 and extends at least partially into area $Y_5$ of isolated pad 416. This area will eventually serve at the contact pad 455 for the second electrode 409.

Figure 26:
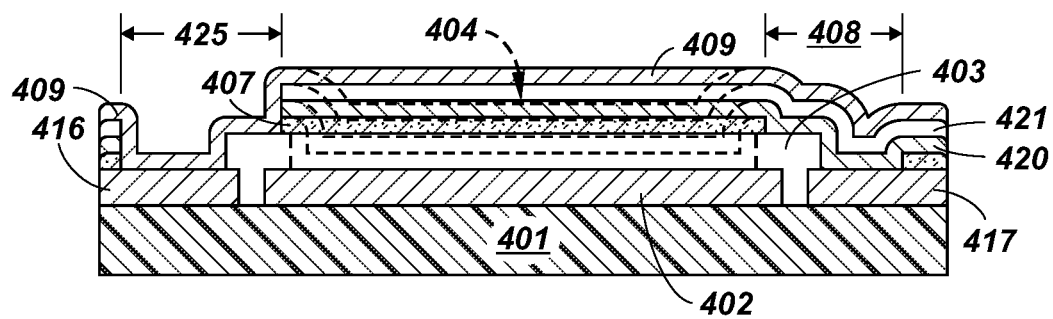
FIG. 26 is a cross-sectional view after formation of a second sealing region over another portion 406 and isolated pad 416, followed by the deposition of the second electrode.

FIG. 26 is the cross-sectional view where, starting from FIG. 25, sealing region 425 was formed by removal of the layers overlying portion 406 and adjacent isolated pad 417, followed by uniform deposition of the second electrode 409. Note that the second electrode 409 will be in direct contact with isolated pad 416 in region $Y_5$.

Figure 27:
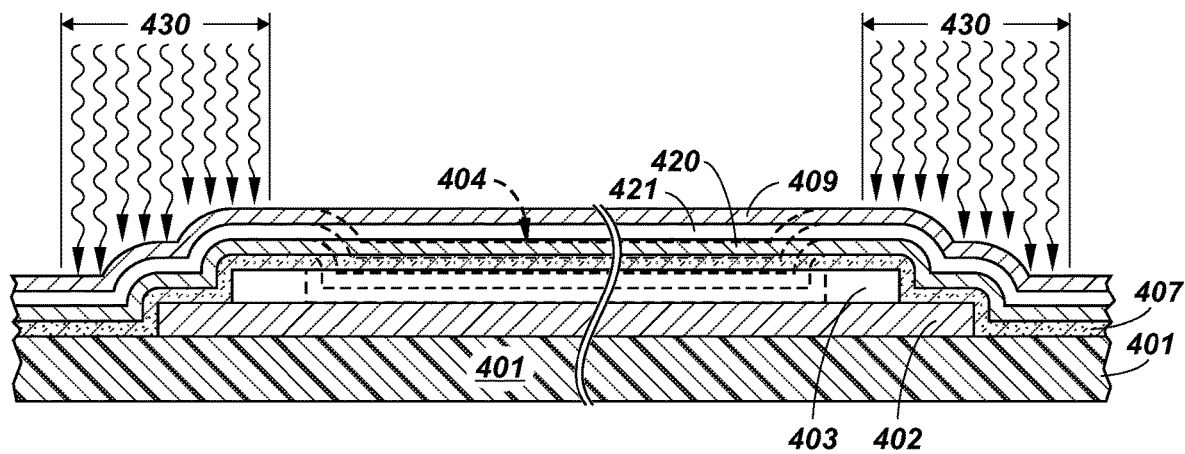
FIG. 27 is a cross-sectional view after the steps shown in FIGS. 25 and 26 showing the formation of third sealing regions.

FIG. 27 is the cross-sectional view according to FIG. 24c after all of the steps described in FIGS. 25 and 26. This figure also indicates the position of third sealing regions 430 where all of the layers overlying the first electrode 402 in area $X_5$ will be removed. The third sealing region has two separate regions as indicated. The sealing regions 430 are located partially over both portions 406 and extends at least partially into area $X_5$ of first electrode 402. These areas will eventually serve as two separate contact pads 460 for the first electrode 402.

Figure 28:
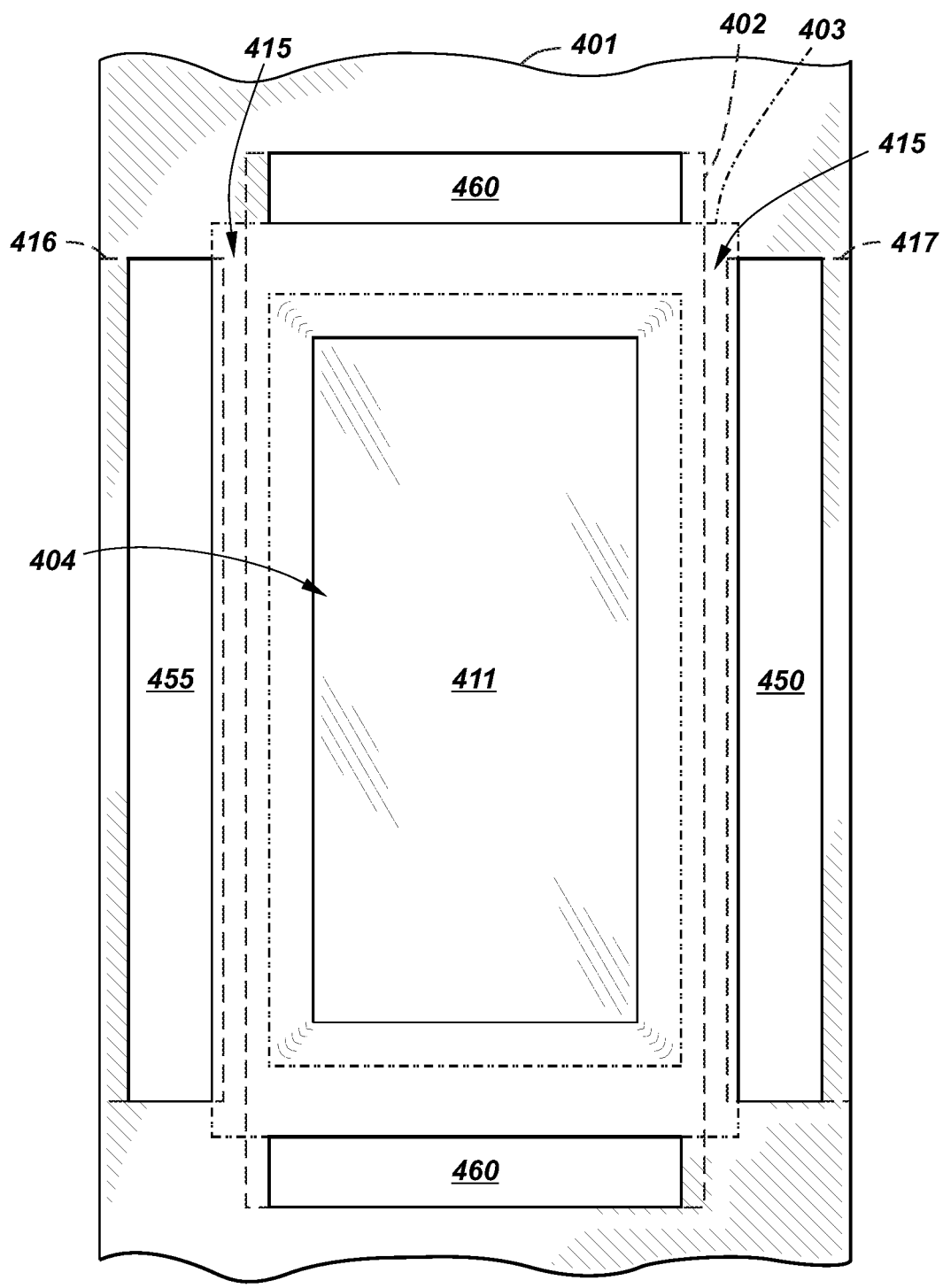
FIG. 28 is a top view of the completed device of the 5$^{th}$ embodiment.

The color tunable OLED panel can then be completed by depositing an optional protective layer 410 followed by thin-film encapsulation 411 (both uniformly and without patterning) and clearing of any overlying layers from the two contact pads 460 for the first electrode, the contact pad 450 for the intermediate electrode and the contact pad 455 for the second electrode as described previously. A top view of the completed device is shown in FIG. 28.

Experimental Examples

Functional mask-free OLED panels were produced according to the first embodiment. A stack of organic materials approximately 300 nm thick was uniformly deposited without masking over a substrate of an inorganic insulator layer (100 nm $SiO_2$) over an ITO layer (145 nm) over a 0.7 mm thick soda lime glass substrate. A $CO_2$ laser with 9.3 um wavelength (Keyence ML-Z9500A) was then used to clear a 2 mm wide region of the organic material over the $SiO_2$ inorganic insulator layer. A 100 nm thick cathode layer of Ag was then uniformly deposited without masking over the substrate. After encapsulation using a laminated film consisting of a metal foil with a getter-containing adhesive, the excess Ag metal around the perimeter of the panel and outside the encapsulation was removed by peeling it off with tape. Control OLED panels were produced using a standard method of depositing the organic materials through one shadow mask, and then depositing the cathode layer through a second shadow mask. The OLED panels had an emitting area of 15 square centimeters. A comparison of the average OLED performance (at a current density of 3 $mA/cm^2$) for five control and three inventive panels is shown in Table 1.

TABLE 1

Comparison of Control and Inventive OLED panels

| Type | Voltage | $Cd/m^2$ | Cd/A | CIEx | CIEy | Lm/W | EQE |
|---|---|---|---|---|---|---|---|
| Control | 3.1 | 1568 | 52.2 | 0.451 | 0.538 | 53.7 | 16.1 |
| Inv | 3.3 | 1823 | 60.8 | 0.443 | 0.544 | 57.9 | 18.5 |

The results in Table 1 illustrate that OLED lighting panels can be prepared without the use of any shadow masking that provide similar performance to those prepared with shadow masking.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

The invention claimed is:

1. A method for making an OLED lighting panel on a substrate having length and width dimensions comprising the steps of:
   patterning a first electrode layer over the substrate so that some portions of the substrate are not covered by the first electrode layer;
   patterning an inorganic insulation layer at least partially over the first electrode layer such that:
   a) the inorganic insulation layer surrounds an enclosed area of the first electrode layer where portions of the inorganic insulation layer are in the width dimension and have at least one horizontal thickness $HT_{W\text{-}iil}$ and portions of the inorganic insulation layer are in the length dimension and have at least one horizontal thickness $HT_{L\text{-}iil}$;
   b) where at least part of one of the portions in the length or width dimension has a horizontal thickness that is greater than at least part of the same or other dimension; and
   c) the inorganic insulating layer is arranged such that at least some part of the first electrode layer lies outside the enclosed area adjacent to the portion(s) of inorganic insulation layer whose horizontal thickness is greater and at least some part of the substrate lies outside the enclosed area adjacent to the portion(s) of inorganic insulation layer whose horizontal thickness is less;
   depositing at least one organic layer for light emission over the length and width of the substrate;
   removing the at least one organic layer over a sealing region; the sealing region being located in part over the inorganic insulation layer wherein:
   a) the horizontal thickness of at least one portion of the sealing region ($HT_{W\text{-}s}$ or $HT_{L\text{-}s}$) is less than the at least one portion of the horizontal thickness of the inorganic insulation layer ($HT_{W\text{-}iil}$ or $HT_{L\text{-}iil}$) so that the least one portion of the sealing region lies entirely over at least one of the portions of the inorganic insulation layer whose horizontal thickness is greater; and
   b) where at least another portion of the sealing region ($HT_{W\text{-}s}$ or $HT_{L\text{-}s}$) lies partially over the portion of inorganic insulation layer ($HT_{W\text{-}iil}$ or $HT_{L\text{-}iil}$) whose horizontal thickness is less and partially over at least the part of the substrate located on the opposite side from the enclosed area; and
   depositing a second electrode layer over the length and width of the substrate.

2. The method of claim 1 where there is a further step of depositing a passivating layer over the entire length and width of the second electrode layer.

3. The method of claim 1 where there is a further step of depositing thin-film encapsulation or lamination-type encapsulation over at least the enclosed area and sealing region.

4. The method of claim 3 where there is more than one enclosed area on a single substrate and a further step after the encapsulation where the substrate is divided into at least two individual sections, each containing at least one encapsulated enclosed area.

5. The method of claim 1 where the at least one organic layer is removed from the sealing region by laser treatment.

6. The method of claim 1 where the horizontal thickness of the sealing region is the same throughout ($HT_{W\text{-}s}=HT_{L\text{-}s}$).

7. The method of claim 1 where the horizontal thickness of the sealing region is constant along a single dimension.

8. The method of claim 1 where the horizontal thickness of the sealing region changes along a single direction.

9. A method for making an OLED lighting panel on a substrate having length and width dimensions comprising the steps of:
   patterning a first electrode layer over the substrate so that some portions of the substrate are not covered by the first electrode layer;
   patterning an inorganic insulation layer at least partially over the first electrode layer such that:
   a) the inorganic insulation layer surrounds an enclosed area of the first electrode layer where the inorganic insulation layer in the width dimension and the inorganic insulation layer in the length dimension both have the same horizontal thickness ($HT_{w\text{-}iil}=HT_{L\text{-}iil}$); and
   b) the inorganic insulating layer is arranged such that at least some part of the first electrode layer lies outside the enclosed area adjacent to the portion(s) of inorganic insulation layer in one dimension and at least some part of the substrate lies outside the enclosed area adjacent to the portion(s) of inorganic insulation layer in the other dimension;
   depositing at least one organic layer for light emission over the length and width of the substrate;
   removing the at least one organic layer over a sealing region; the sealing region located in part over the inorganic insulation layer and having at least one horizontal thickness $HT_{W\text{-}s}$ in the width dimension and at least one horizontal thickness $HT_{L\text{-}s}$ in the length dimension, wherein:
   a) at least one portion of $HT_{W\text{-}s}$ is different from $HT_{L\text{-}s}$;
   b) where at least some part of the first electrode layer is outside the enclosed area adjacent to a portion of inorganic insulation layer, the sealing region lies entirely on the inorganic insulation layer and the horizontal thickness of the sealing region ($HT_{W\text{-}s}$ or $HT_{L\text{-}s}$) is such that it is less than the horizontal thickness of the underlying inorganic insulation layer ($HT_{W\text{-}iil}$ or $HT_{L\text{-}iil}$) so that the portions of the sealing region lie entirely over the portions of the inorganic insulation layer adjacent to the first electrode layer; and
   c) where at least some part of the substrate is outside the enclosed area is adjacent to a portion of inorganic insulation layer, the horizontal thickness of the sealing region ($HT_{W\text{-}s}$ or $HT_{L\text{-}s}$)is such that the sealing region lies partially over the portions of the inorganic insulation layer and at least partially over at least part of the substrate;
   depositing a second electrode over the length and width of the substrate.

10. The method of claim 9 where there is an optional further step of depositing a passivating layer over the entire length and width of the second electrode.

11. The method of claim 9 where there is a further step of depositing thin-film encapsulation or lamination-type encapsulation over at least the enclosed area and sealing region.

12. The method of claim 11 where there is more than one enclosed area on a single substrate and a further step after the encapsulation where the substrate is divided into at least two individual sections, each containing at least one encapsulated enclosed area.

13. The method of claim 9 where the horizontal thickness of the sealing region is constant along a single dimension.

14. The method of claim 9 where the horizontal thickness of the sealing region changes along a single direction.

15. The method of claim 9 where there is at least one electrically conductive isolated pad over the substrate and separated from the first electrode layer by a gap and the inorganic insulation layer extends over the edge of the first electrode layer and at least partially over the gap and the second electrode makes electrical contact with the isolated pad.

\* \* \* \* \*

UNITED STATES PATENT AND TRADEMARK OFFICE
CERTIFICATE OF CORRECTION

| | |
|---|---|
| PATENT NO. | : 10,923,689 B2 |
| APPLICATION NO. | : 16/956863 |
| DATED | : February 16, 2021 |
| INVENTOR(S) | : John Hamer and Jeffrey Spindler |

Page 1 of 1

It is certified that error appears in the above-identified patent and that said Letters Patent is hereby corrected as shown below:

In the Specification

Column 1, Line 13, "Award DE-FOA-0001613" should read --Award DE-EE0008211--.

Column 1, Line 15, "Tunable While OLED" should read --Tunable White OLED--.

Signed and Sealed this
Twenty-fifth Day of November, 2025

John A. Squires
*Director of the United States Patent and Trademark Office*